United States Patent
Bunyk et al.

(10) Patent No.: US 8,772,759 B2
(45) Date of Patent: Jul. 8, 2014

(54) SYSTEMS, DEVICES, AND METHODS FOR ANALOG PROCESSING

(75) Inventors: Paul Bunyk, Vancouver (CA); Felix Maibaum, Braunschweig (DE)

(73) Assignee: D-Wave Systems Inc., Burnaby (CA)

( * ) Notice: Subject to any disclaimer, the term of this patent is extended or adjusted under 35 U.S.C. 154(b) by 29 days.

(21) Appl. No.: 13/611,672

(22) Filed: Sep. 12, 2012

(65) Prior Publication Data

US 2013/0005580 A1 Jan. 3, 2013

Related U.S. Application Data

(60) filed as application No. PCT/US2009/037984 on Mar. 23, 2009, now Pat. No. 8,421,053.

(60) Provisional application No. 12/934,254, provisional application No. 61/039,041, filed on Mar. 24, 2008, provisional application No. 61/039,710, filed on Mar. 26, 2008.

(51) Int. Cl.
*H01L 39/22* (2006.01)
*G11C 11/44* (2006.01)

(52) U.S. Cl.
USPC .............. 257/31; 257/E39.003; 257/E29.071; 505/170

(58) Field of Classification Search
CPC .... B82Y 10/00; G06N 99/002; H01L 39/223; H01L 27/18
USPC ......... 257/31, 9, E39.003, E29.071; 505/170, 505/193, 234
See application file for complete search history.

(56) References Cited

U.S. PATENT DOCUMENTS

| | | | |
|---|---|---|---|
| 7,843,209 B2 | 11/2010 | Berkley | 326/7 |
| 7,876,248 B2 | 1/2011 | Berkley et al. | 341/133 |
| 2005/0224784 A1 | 10/2005 | Amin et al. | 257/14 |
| 2005/0250651 A1 | 11/2005 | Amin et al. | 505/846 |
| 2005/0256007 A1 | 11/2005 | Amin et al. | 505/170 |
| 2006/0097747 A1 | 5/2006 | Amin | 326/6 |
| 2006/0147154 A1 | 7/2006 | Thom et al. | 385/37 |
| 2006/0225165 A1 | 10/2006 | Maassen van den Brink et al. | 977/933 |
| 2008/0035911 A1 | 2/2008 | Gilbert et al. | 257/14 |
| 2008/0176750 A1 | 7/2008 | Rose et al. | 505/170 |
| 2008/0215850 A1 | 9/2008 | Berkley et al. | 712/1 |
| 2008/0238531 A1 | 10/2008 | Harris | 327/528 |

(Continued)

OTHER PUBLICATIONS

Blatter et al., "Design aspects of superconducting-phase quantum bits," *Physical Review B* 63:174511-1-174511-9, 2001.

(Continued)

*Primary Examiner* — Nikolay Yushin
(74) *Attorney, Agent, or Firm* — Seed IP Law Group PLLC

(57) ABSTRACT

A system may include first and second qubits that cross one another and a first coupler having a perimeter that encompasses at least a part of the portions of the first and second qubits, the first coupler being operable to ferromagnetically or anti-ferromagnetically couple the first and the second qubits together. A multi-layered computer chip may include a first plurality N of qubits laid out in a first metal layer, a second plurality M of qubits laid out at least partially in a second metal layer that cross each of the qubits of the first plurality of qubits, and a first plurality N times M of coupling devices that at least partially encompasses an area where a respective pair of the qubits from the first and the second plurality of qubits cross each other.

17 Claims, 11 Drawing Sheets

(56) References Cited

U.S. PATENT DOCUMENTS

| | | | |
|---|---|---|---|
| 2008/0274898 A1 | 11/2008 | Johnson et al. | 505/190 |
| 2009/0078931 A1 | 3/2009 | Berkley | 257/31 |
| 2009/0078932 A1 | 3/2009 | Amin | 257/31 |
| 2009/0082209 A1 | 3/2009 | Bunyk et al. | 505/190 |
| 2009/0102580 A1 | 4/2009 | Uchaykin | 333/185 |
| 2009/0121215 A1 | 5/2009 | Choi | 257/31 |
| 2009/0192041 A1 | 7/2009 | Johansson et al. | 505/170 |

OTHER PUBLICATIONS

Blaugher et al., "The Superconductivity of Some Intermetallic Compounds," IBM Journal, Jan. 1962, 3 pages.

Friedman et al., "Quantum superposition of distinct macroscopic states," *Nature* 406:43-46, Jul. 6, 2000.

Il'ichev et al., "Continuous Monitoring of Rabi Oscillations in a Josephson Flux Qubit," *Physical Review Letters* 91(9):097906-1-097906-4, week ending Aug. 29, 2003.

International Search Report, mailed Oct. 28, 2009, for PCT/US2009/037984, 3 pages.

Maibaum et al., "Systems, Devices, and Methods for Analog Processing," U.S. Appl. No. 61/039,710, filed Mar. 26, 2008, 48 pages.

Makhlin et al., "Quantum-State Engineering with Josephson-Junction Devices," *Reviews of Modern Physics* 73(2):357-400, Apr. 2001.

Mooij et al., "Josephson Persistent-Current Qubit," *Science* 285: 1036-1039, Aug. 13, 1999.

Neufeld et al., "Systems, Methods and Apparatus for a Superconducting Probe Card," U.S. Appl. No. 61/039,041, filed Mar. 24, 2008, 34 pages.

Orlando et al., "Superconducting Persistent-Current Qubit," *Physical Review B* 60(22):15 398-15 413, Dec. 1, 1999.

Semiconductor Probe Needles: Part Number Definition, Material Properties and Measuring Style, Veridiam Point Tech Product References, Probe Needle Part Number Clarification, Terminology, Tolerances and Material Properties, URL=http://www.pointtech.com/pdf/def_mat_number.pdf, download date Jan. 25, 2011, 1 page.

Thom et al., "Input/Output System and Devices for Use With Superconducting Devices," U.S. Appl. No. 12/016,801, filed Jan. 18, 2008, 132 pages.

Written Opinion, mailed Oct. 28, 2009, for PCT/US2009/037984, 3 pages.

Grajcar et al., "Four-qubit device with mixed coupling", 2006, Phys. Rev. Letters, vol. 98, pp. 047006-1-047006-5, Feb. 2, 2006.

Bunyk et al., "Systems, Devices, and Methods for Analog Processing," Office Action mailed Aug. 3, 2012, for U.S. Appl. No. 12/934,254, 7 pages.

Bunyk et al. "Qubit Based Systems, Devices, and Methods for Analog Processing," Amendment filed Oct. 10, 2012, for U.S. Appl. No. 12/934,254, 13 pages.

SYSTEMS, DEVICES, AND METHODS FOR ANALOG PROCESSING

CROSS REFERENCE TO RELATED APPLICATIONS

This application is a continuation of U.S. patent application Ser. No. 12/934,254, filed Sep. 23, 2010 and entitled "Systems, Devices, and Methods for Analog Processing," which is a U.S. national stage application filed under 35 U.S.C. §371 of International Patent Application PCT/US2009/037984, accorded an international filing date of Mar. 23, 2009 and entitled "Systems, Devices, and Methods for Analog Processing," which claims benefit under 35 U.S.C. 119(e) of U.S. Provisional Patent Application Ser. No. 61/039,041, filed Mar. 24, 2008 and entitled "Systems, Methods and Apparatus for a Superconducting Probe Card", and U.S. Provisional Patent Application Ser. No. 61/039,710 filed Mar. 26, 2008 and entitled "Systems, Devices, and Methods for Analog Processing."

BACKGROUND

1. Field

This disclosure generally relates to analog computing and analog processors, for example, quantum computing and quantum processors.

2. Description of the Related Art

Approaches to Quantum Computation

There are several general approaches to the design and operation of quantum computers. One such approach is the "circuit model" of quantum computation. In this approach, qubits are acted upon by sequences of logical gates that are the compiled representation of an algorithm. Much research has been focused on developing qubits with sufficient coherence to form the basic elements of circuit model quantum computers.

Another approach to quantum computation, involves using the natural physical evolution of a system of coupled quantum systems as a computational system. This approach does not make use of quantum gates and circuits. Instead, the computational system starts from a known initial Hamiltonian with an easily accessible ground state and is controllably guided to a final Hamiltonian whose ground state represents the answer to a problem. This approach does not require long qubit coherence times and may be more robust than the circuit model. Examples of this type of approach include adiabatic quantum computation and quantum annealing.

Superconducting Qubits

Superconducting qubits are a type of superconducting quantum device that can be included in a superconducting integrated circuit. Superconducting qubits can be separated into several categories depending on the physical property used to encode information. For example, they may be separated into charge, flux and phase devices. Charge devices store and manipulate information in the charge states of the device. Flux devices store information in a variable related to the magnetic flux through some part of the device. Phase devices store information in a variable related to the difference in superconducting phase between two regions of the phase device. Recently, hybrid devices using two or more of charge, flux and phase degrees of freedom have been developed.

Superconducting integrated circuits may include single flux quantum (SFQ) devices. The integration of SFQ devices with superconducting qubits is discussed in U.S. patent application Ser. No. 11/950,276.

BRIEF SUMMARY

A system may be summarized as including a first qubit, a second qubit, wherein a portion of the first qubit crosses the second qubit, and a coupler, having a perimeter, providing a coupling between the first qubit and the second qubit and proximate to the portion of the first qubit that crosses the second qubit.

The first qubit may cross the second qubit substantially perpendicularly. The perimeter of the coupler may encompass at least a part of the portion of the first qubit that crosses the second qubit. The perimeter of the coupler may encompass a first portions of the first qubit that does not cross the second qubit and a second portion of the second qubit that does not cross the first qubit. The perimeter of the coupler may include a first arm extending substantially parallel to a length of the first qubit and a second arm extending substantially parallel to a length of the second qubit. The first qubit may include a first qubit loop of superconducting material that is superconductive at a first critical temperature and at least one Josephson junction, the second qubit includes a second qubit loop of superconducting material that is superconductive at a second critical temperature and at least one Josephson junction, and the coupler includes a coupling loop of superconducting material that is superconductive at a third critical temperature. The coupling loop may be interrupted by at least one Josephson junction. The coupler may be on a separate layer from the first and the second qubits. The coupler may be on a same layer as one of the first or the second qubits. The first coupler may be operable to at least one of ferromagnetically, anti-ferromagnetically and transversely couple the first qubit and the second qubit.

A multi-layered computer chip may be summarized as a first plurality N of qubits laid out at least partially in a first metal layer, a second plurality M of qubits laid out at least partially in a second metal layer; each of the qubits of the second plurality of qubits cross each of the qubits of the first plurality of qubits, and a first plurality N times M of coupling devices, each of the coupling devices proximate to where a respective pair of the qubits from the first and the second plurality of qubits cross each other.

At least of the coupling devices may include a first arm extending substantially parallel to a length of a qubit of the first plurality of N qubits and a second arm extending substantially parallel to a length a second qubit of the second plurality of M qubits. The plurality of coupling devices may be laid out at least partially in the second metal layer. M may be equal to N. The multi-layered computer chip may include a metal shielding layer positioned to reduce magnetic noise around the qubits and the couplers. The second plurality of qubits may be laid out in both the second metal layer and the first metal layer and a plurality of vias may provide respective current paths between the second and the first metal layers. The plurality of coupling devices may be laid out in both the second metal layer and the first metal layer and a plurality of vias may provide respective current paths between the second and the first metal layers. The qubits of the first plurality of qubits may be arranged parallel to one another, the qubits of the second plurality of qubits may be arranged parallel to one another, and the qubits of the second plurality of qubits may be arranged perpendicularly with respect to the qubits of the first plurality of qubits. The qubits of the first plurality of qubits may be arranged in a consecutive order from a first to an $n^{th}$ qubit, the qubits of the second plurality of qubits are arranged in a consecutive order from a first qubit to an $m^{th}$ qubit, the first qubit of the first plurality of qubits is ferromagnetically coupled to the first qubit of the second plurality of qubits, a second qubit of the first plurality of qubits is ferromagnetically coupled to a second qubit of the second plurality of qubits, a third qubit of the first plurality of qubits is ferromagnetically coupled to a third qubit of the second plurality of qubits, a fourth qubit of the first plurality of qubits is ferromagnetically coupled to a fourth qubit of the second plurality of qubits, the first qubit of the first plurality of qubits is controllably coupleable to each of the second, the third and the fourth qubits of the second plurality of qubits, the second qubit of the first plurality of qubits is controllably coupleable to each of the first, the third and the fourth qubits of the second plurality of qubits, the third qubit of the first plurality of qubits is controllably coupleable to each of the first, the second, and the fourth qubits of the second plurality of qubits, and the fourth qubit of the first plurality of qubits is controllably coupleable to each of the first, the second, and the third qubits of the second plurality of qubits to form a first $K_4$ block. The multi-layered computer chip may include a third plurality I of qubits laid out in a first metal layer, a fourth plurality J of qubits laid out at least partially in a second metal layer; each of the qubits of the second plurality of qubits cross each of the qubits of the first plurality of qubits, a fifth plurality K of qubits laid out in a first metal layer, a sixth plurality L of qubits laid out at least partially in a second metal layer; each of the qubits of the second plurality of qubits cross each of the qubits of the first plurality of qubits, a second plurality I times J of coupling devices, each of the coupling devices of the second plurality of coupling devices at least partially encompassing an area where a respective pair of the qubits from the third and the fourth plurality of qubits cross each other, wherein the qubits of the third plurality of qubits are arranged in a consecutive order from a first to an nth qubit, the qubits of the fourth plurality of qubits are arranged in a consecutive order from a first qubit to an nth qubit, the first qubit of the third plurality of qubits is controllably coupleable to each of the first, the second, the third and the fourth qubits of the fourth plurality of qubits, the second qubit of the third plurality of qubits is controllably coupleable to each of the first, the second, the third and the fourth qubits of the fourth plurality of qubits, the third qubit of the third plurality of qubits is controllably coupleable to each of the first, the second, the third, and the fourth qubits of the fourth plurality of qubits, and the fourth qubit of the third plurality of qubits is controllably coupleable to each of the first, the second, the third, and the fourth qubits of the fourth plurality of qubits to form a first bipartite block, and a third plurality K times L of coupling devices, each of the coupling devices of the second plurality of coupling devices at least partially encompassing an area where a respective pair of the qubits from the third and the fourth plurality of qubits cross each other, wherein the qubits of the fifth plurality of qubits are arranged in a consecutive order from a first to an nth qubit, the qubits of the sixth plurality of qubits are arranged in a consecutive order from a first qubit to an nth qubit, the first qubit of the fifth plurality of qubits is ferromagnetically coupled to the first qubit of the sixth plurality of qubits, a second qubit of the fifth plurality of qubits is ferromagnetically coupled to a second qubit of the sixth plurality of qubits, a third qubit of the fifth plurality of qubits is ferromagnetically coupled to a third qubit of the sixth plurality of qubits, a fourth qubit of the fifth plurality of qubits is ferromagnetically coupled to a fourth qubit of the sixth plurality of qubits, the first qubit of the fifth plurality of qubits is controllably coupleable to each of the second, the third and the fourth qubits of the sixth plurality of qubits, the second qubit of the fifth plurality of qubits is controllably coupleable to each of the first, the third and the fourth qubits of the sixth plurality of qubits, the third qubit of the fifth plurality of qubits is controllably coupleable to each of the first, the second, and the fourth qubits of the sixth plurality of qubits, and the fourth qubit of the fifth plurality of qubits is controllably coupleable to each of the first, the second, and the third qubits of the sixth plurality of qubits to form a second $K_4$ block, and wherein the qubits of the third plurality of qubits are ferromagnetically coupled with respective ones of the qubits of the first plurality of qubits and wherein the qubits from the fourth plurality of qubits are ferromagnetically coupled with respective ones of the qubits of the sixth plurality of qubits to form a first $K_8$ block. The multi-layered computer chip may include an additional plurality of qubits and an additional plurality of couplers configured to form a second $K_8$ block, wherein at least one qubit from the first $K_8$ block is controllably coupled to at least one qubit from the second $K_8$ block. At least one of the couplers may be a corner coupler that is operable to couple at least one qubit from the first $K_4$ block to a corresponding respective qubit from the either the fifth or the sixth plurality of qubits. The multi-layered computer chip may include a superconducting probe card to establish an interface between the multi-layered computer chip and a digital computer, the superconducting probe including a printed circuit board including a dielectric medium that carries at least a first conductive trace, wherein the first conductive trace is formed by a material that is superconducting below a critical temperature, and at least a first conductive needle that is at least partially formed by a material that is superconducting below a critical temperature, wherein a first end of the first conductive needle is communicably coupled to the first conductive trace on the printed circuit board and a second end of the first conductive needle is tapered to form a point.

A superconducting probe card may be summarized as including a printed circuit board including a dielectric medium that carries at least a first conductive trace, wherein the first conductive trace is formed by a material that is superconducting below a critical temperature; and at least a first conductive needle that is at least partially formed by a material that is superconducting below a critical temperature, wherein a first end of the first conductive needle is communicably coupled to the first conductive trace on the printed circuit board and a second end of the first conductive needle is tapered to form a point; wherein the critical temperature of the first conductive trace and the critical temperature of the first conductive needle are both approximately equal to or greater than an operating temperature of the superconducting probe card. The printed circuit board may carry at least a first contact pad that is formed by a material that is superconducting below a critical temperature, and the first contact pad may be superconductingly communicably coupled to the first conductive trace, such that the communicable coupling between the first conductive trace and the first conductive needle is realized through the first contact pad. The first end of the first conductive needle may be coated with a solderable material that is superconducting below a critical temperature, such that the first end of the first conductive needle may be communicably coupled to the first contact pad on the printed circuit board by a superconducting solder connection. The solderable material may include zinc. The solderable material may include at least one of tin and lead. The first conductive needle may be formed of an alloy of tungsten-rhenium where the proportion of rhenium in the alloy is greater than 4% and less than 50%. The proportion of rhenium in the alloy may be in the range of 10%-40%. The proportion of rhenium in the alloy may be approximately 26%. The printed circuit board may include a hole through the dielectric medium and the first conductive needle may include a bend in its length such that the point at the second end of the first conductive needle extends through the hole. The second end of the first conductive needle may be superconductingly communicably coupled to a superconducting device. The superconducting device may include a superconducting integrated circuit. The superconducting device may include a superconducting processor. The superconducting processor may include a superconducting quantum processor. The superconducting quantum processor may include at least one device selected from the group consisting of: a superconducting flux qubit, a superconducting phase qubit, a superconducting charge qubit, a superconducting hybrid qubit, a superconducting coupling device, and a superconducting readout device.

The superconducting probe card may further include a plurality of additional conductive traces carried by the dielectric medium, wherein each of the additional conductive traces is formed by a material that is superconducting below a critical temperature; and a plurality of additional conductive needles, wherein each of the additional conductive needles is formed by a material that is superconducting below a critical temperature and wherein a respective first end of each of the additional conductive needles is communicably coupled to at least one of the plurality of additional conductive traces and a respective second end of each of the additional conductive needles is tapered to from a point; wherein the critical temperature of the plurality of additional conductive traces and the critical temperature of the plurality of additional conductive needles are both approximately equal to or greater than the operating temperature of the superconducting probe card. The printed circuit board may carry a plurality of contact pads, wherein each contact pad is formed by a material that is superconducting below a critical temperature, and wherein each contact pad is superconductingly communicably coupled to a respective one of the conductive traces such that each communicable coupling between a conductive trace and at least one conductive needle is realized through a respective contact pad. The first end of each conductive needle may be coated with a solderable material that is superconducting below a critical temperature, and the first end of each conductive needle may be communicably coupled to at least one contact pad on the printed circuit board by a superconducting solder connection. The printed circuit board may include a hole through the dielectric medium and each conductive needle includes a bend in its length such that the point at the second end of each conductive needle extends through the hole. The second end of each conductive needle may be superconductingly communicably coupled to at least one contact pad carried by a superconducting device. The dielectric medium, the first conductive trace, and the first conductive needle may each be formed by materials that are substantially non-magnetic. The superconducting probe card may include at least two conductive needles that are both communicably coupled to the same conductive trace on the printed circuit board. The first conductive needle may include a plated layer of the material that is superconducting below the critical temperature.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

DETAILED DESCRIPTION OF THE INVENTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with quantum processors, qubits, couplers, controller, readout devices and/or interfaces have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

Systems for Solving Computational Problems

Figure 1A:
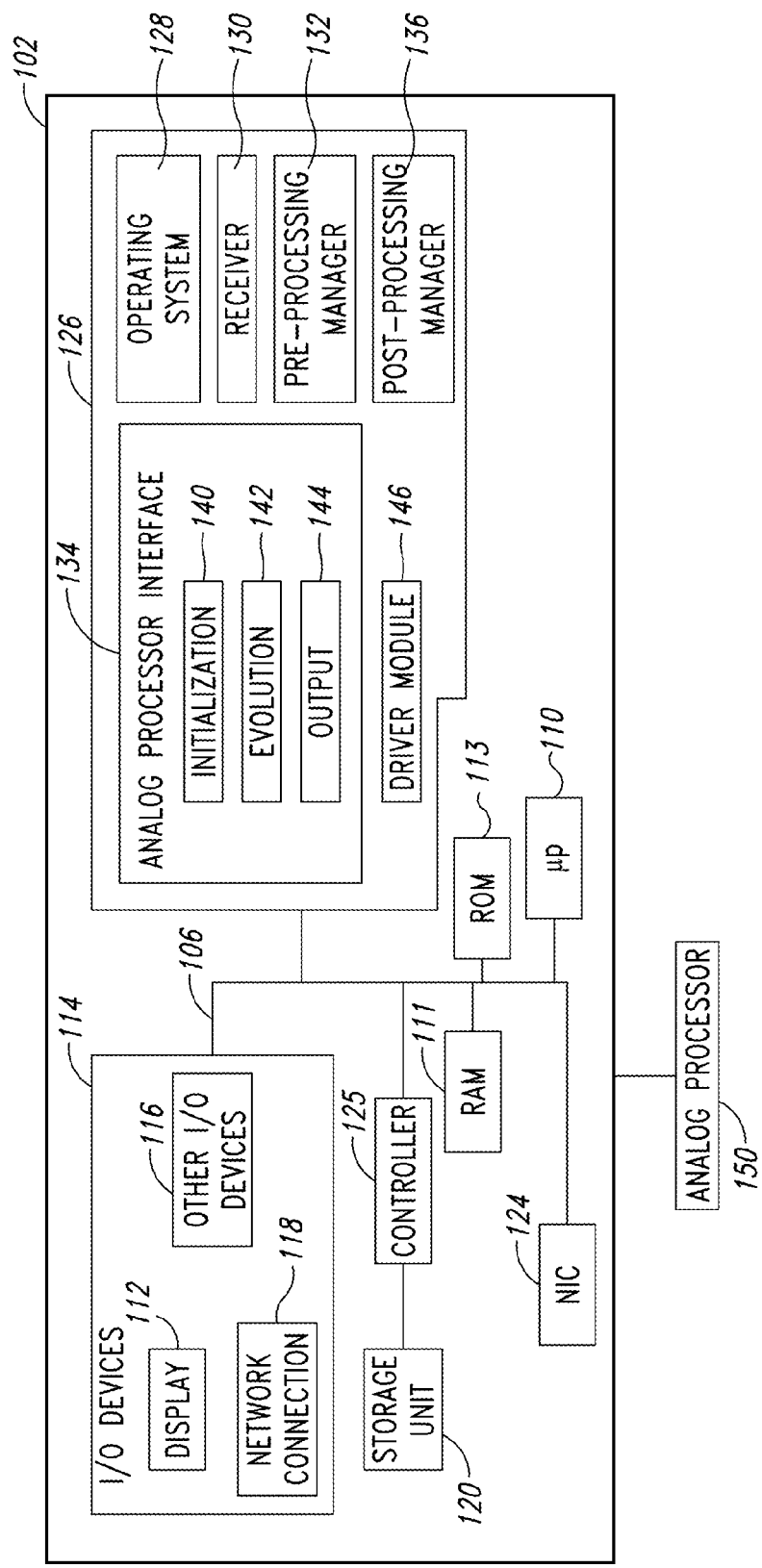
FIGS. 1A and 1B are functional diagrams showing systems for solving computational problems according to one illustrative embodiment.

FIG. 1A shows an exemplary problem-solving system 100. Problem-solving system 100 may include a computer 102 and an analog processor 150. An analog processor is a processor that employs the fundamental properties of a physical system to find the solution to a computation problem. In contrast to a digital processor, which requires an algorithm for finding the solution followed by the execution of each step in the algorithm according to Boolean methods, analog processors do not involve Boolean methods.

Computer 102 may include one or more controllers such as microprocessor 110, non-volatile storage controller 125, digital signal processor (DSP) (not shown), analog processor 150, and the like. Computer 102 may further include one or more memories 126 coupled to controllers 110, 125, 150 by one or more busses 106. Examples of the one or more memories include a system memory 126, such as high speed random-access memory (RAM), for storing system control programs (e.g., operating system 128, application programs loaded from main non-volatile storage unit 120, data, and the like), and a read-only memory (ROM). Computer 102 may also include a main non-volatile storage unit 120, a user interface 114, a network interface card (NIC) 124, communication circuitry, a network connection 118, and the like. NIC 124, communication circuitry, network connection 118 and the like may provide one or more communication paths, for example allowing the system to communicate with one or more external devices (e.g., external computing systems, server computing systems, memories, etc). User interface 114 may also include one or more input devices 116 including a display 112, a mouse, a keyboard, and other peripheral devices.

Computer 102 may include an operating system 128 for handling various system services, such as file services, and for performing hardware dependent tasks. Examples of operating system 128 include UNIX, Windows NT, Windows XP, DOS, LINUX, VMX, and the like. Alternatively, no operating system 128 may be present and instructions may be executed, for example, in a daisy chain manner. In an embodiment, computer 102 may take the form of a digital computer. In another embodiment, analog processor 150 may be in communication with computer 102.

Figure 1B:
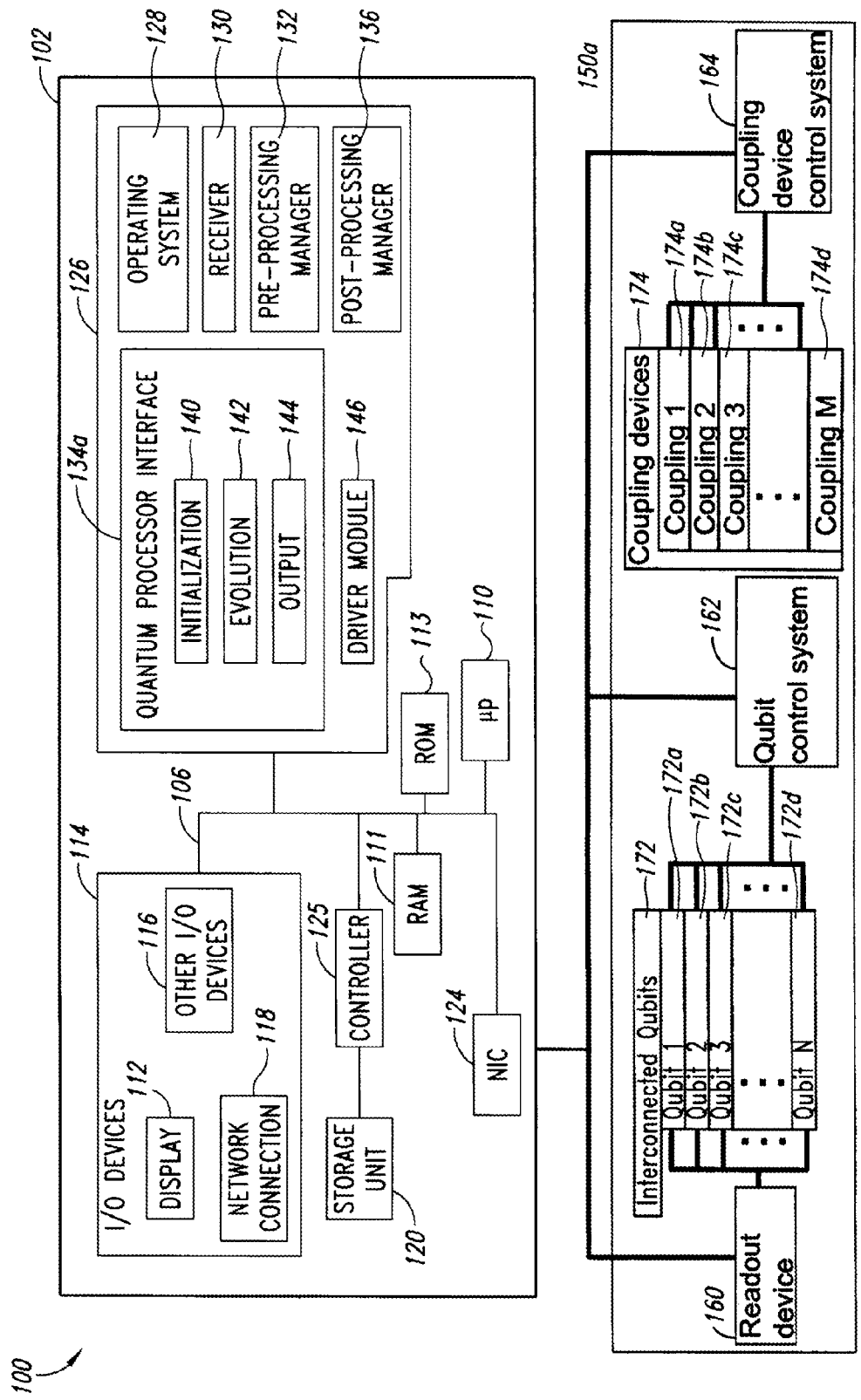

Analog processor 150 may take the form of quantum processor 150a shown in FIG. 1B, including a plurality of qubits 172a-172d (only four called out in figure) forming an interconnected topology, a plurality of coupling devices 174a-174d (only four called out in figure), a readout device 160, a qubit control system 162, and a coupling device control system 164. Quantum processor 150a may include at least two qubits 172a, 172b, at least one coupling device 174a, and at least one local bias device.

Interconnected topology of qubits 172, collectively, serves as the basis for performing quantum computation, and may take the form of superconducting qubits. Examples of qubits include quantum particles, atoms, electrons, photons, ions, and the like. Typical superconducting qubits, for example, have the advantage of scalability and are generally classified depending on the physical properties used to encode information including, for example, charge and phase devices, phase or flux devices, hybrid devices, and the like.

Quantum processor 150a may further include a readout device 160. Readout device 160 may include a plurality of dc-SQUID magnetometers, each inductively connected to a different qubit within interconnected topology 172. NIC 124 may be configured to receive a voltage or current from readout device 160. The dc-SQUID magnetometers including a loop of superconducting material interrupted by at least one Josephson junctions are well known in the art.

Qubit control system 162 may include one or more controllers for interconnected topology of qubits 172. Coupling device control system 164 may include one or more coupling controllers for the coupling devices, collectively 174. Each respective coupling controller in coupling device control system 164 may be configured to tune the coupling strength of a corresponding coupling device 174a-174d from zero to a maximum value. Coupling devices 174 may be tuned, for example, to provide ferromagnetic or anti-ferromagnetic coupling between qubits 172.

Problem-solving system 100 may further include a number of programs and data structures. Typically, some or all of the data structures and programs may be stored in one or more memories including system memory 126, random-access memory 111, read-only memory 113, and the like. Such may include storing information regarding at least one of: a coupling state corresponding to at least one of the controllable coupling devices or an initial basis state corresponding to at least one of the quantum devices. Likewise these programs and data structures or information may be processed using one or more microprocessors 110, analog processors 150, and the like. For ease of presenting the various features and advantages of the present systems, devices, and methods, however, such data structures, and programs are drawn as components of system memory 126. It will be appreciated, however, that at any given time the programs and data structures illustrated in system memory 126 or other information (e.g., information regarding at least one of: a coupling state corresponding to at least one of the controllable coupling devices or an initial basis state corresponding to at least one of the quantum devices) may be stored, for example, in non-volatile storage unit 120. In some embodiments, some or all of the data structures and programs may be stored on one or more remote computers not illustrated in FIG. 1A, provided that the one or more remote computers are addressable by computer 102, i.e., that there is some communication measure between the remote computer and computer 102 such that data can be exchanged among computers over, for example, a data network (e.g., the Internet, a serial connection, a parallel connection, Ethernet, and the like) using a communication protocol (e.g., FTP, telnet, SSH, IP, and the like). In some other embodiments, some or all of the data structures and programs may be redundantly stored and/or processed on one or more remote computers (not shown), provided that the one or more remote computers are addressable by computer 102.

Problem-solving system 100 may further include a receiver 130, a pre-processing manager 132, an analog processor interface 134 such as a quantum processor interface 134a, and a post-processing manager 136. Receiver 130 may be configured to receive problems to be solved on the analog processor 150. Receiver 130 may further be configured to send a response to a computational problem processing request.

In an embodiment, receiver 130, pre-processing manager 132, quantum processor interface 134a and post-processing manager 136 are all implemented in one or more digital computing systems. In another embodiment, at least one of receiver 130, pre-processing manager 132, quantum processor interface 134a, and post-processing manager 136 may be in a location remote from quantum processor 150a.

Microprocessor 110 may be configured to determine an estimate for producing one or more solutions to the computational problem processing requests based in part on a comparison to problems of like complexity.

Analog processor 150 may be operable to produce one or more solutions to computational problems identified by the computational problem processing requests. In some embodiments, analog processor 150 may be operable to obtain one or more solutions to the computational problems via a physical evolution of the analog processor. In another embodiment, problem-solving system 100 may include additional analog processors 150 operable to redundantly co-process one or more solutions to computational problems identified by the computational problem processing requests.

A computational problem may be received by the problem-solving system 100 via a telephone modem, a wireless modem, a local area network connection, a wide area network connection, a portable digital data device, and the like. The information received by receiver 130 may include initial values of couplings between qubits 172, local bias of qubits 172, run-time control parameters, and the like. Alternatively, the information received by receiver 130 may include a graph that represents a computational problem, macro-language instructions, such as AMPL, that define a computational problem, and the like.

Receiver 130 may be operable to provide instructions for scheduling a computation, as well as acquiring the solution to the problem. In an embodiment, a solution of the computation is collected as an output from quantum processor 150a. In another embodiment, receiver 130 may optionally include a graphical user interface (GUI), Command Line Interfaces (CLI), Text User Interface (TUI), and the like. In another embodiment, receiver 130 is operable to receive graphical representations of the computational problem.

Problem-solving system 100 may further include one or more communications links, such as, for example, a network connection 118, for sending and receiving data among at least two of receiver 130, pre-processing manager 132, quantum processor interface 134a, quantum processor 150a, and post-processing manager 136. The communications link may further include an encryption interface (not shown).

Pre-processing manager 132 may be configured to receive the computational problem processing request from receiver 130, and convert the computational problem processing requests into a first series of instructions. Pre-processing manager 132 may further be configured for determining a first Hamiltonian. In an embodiment, pre-processing manager 132 is configured for mapping a computational problem into a problem of an equivalent complexity class. In another embodiment, pre-processing manager 132 includes logic to map the computational problem into at least one of a problem of equivalent, greater or lesser complexity class. In an embodiment, the logic to map the computational problem onto analog processor 150 includes instructions for mapping the computational problem onto a topological representation and embedding the topological representation onto analog processor 150. In an embodiment, the topological representation is in a form of at least one of a planar graph or a non-planar graph. In another embodiment, the topological representation is a graph in the form of a plurality of vertices, and one or more edges. In another embodiment, the topological representation is an interconnected graph of the same structure had by the interconnected topology of qubits.

In another embodiment, pre-processing manager 132 is configured for mapping a computational problem onto analog processor 150, for example, quantum processor 150a. Mapping a computational problem onto analog processor 150 may include, for example, mapping the computational problem onto a graph and embedding the graph onto analog processor 150.

Quantum processor interface 134a may be operable to receive a first series of instructions from pre-processing manager 132. Quantum processor 150a may be configured to receive a second series of instructions from quantum processor interface 134a, and obtain a solution to the computational problem processing request by a physical evolution of the analog processor. Post-processing manager 136 may be configured to convert the solution into a post-processed solution.

Pre-processing manager 132 may include a mapper interface configured to map a computational problem to be solved into a corresponding problem description that is solvable by analog processor 150. The mapper interface may be configured to map problems from one graphical representation into a target graphical representation required for a specific configuration of analog processor 150. In an embodiment, the target graphical representation may include an interconnected topology, analog processor 150 may take the form of a quantum processor 150a that may include a lattice of qubits 172 and coupling devices 174, and each coupling device 174 may be configured to couple two qubits 172 together.

The mapper interface may be configured to map some NP problems (e.g., a mathematical problem such as Maximum Independent Set, Max Clique, Max Cut or k-SAT, or a problem such as an integer programming problem, a constraint optimization problem, a factoring problem, a prediction modeling problem, an operations research problem, a financial portfolio selection problem, a scheduling problem, a supply management problem, a circuit design problem, a travel route optimization problem, a business process simulation problem, an ecological habitat simulation problem, a protein folding simulation problem, a molecular ground state simulation problem or a quantum system simulation problem, and the like) into another NP problem, such as the Ising Spin Glass problem or other problems already mentioned.

Once the target graphical representation needed to solve a desired problem has been mapped by the mapper interface, quantum processor interface 134a is used to set up the coupling values and local bias values for coupling devices 174 and interconnected qubits 172 in order to map the representation onto quantum processor 150a. In an embodiment, three discrete program modules may provide the functions of quantum processor interface 134a: an initialization module 140, an evolution module 142, and an output module 144.

Initialization module 140 may be configured to determine the appropriate values of coupling $J_{ij}$ for coupling devices 174 and values of local bias $h_i$ for interconnected qubits 172. Initialization module 140 may be configured to convert aspects of a problem definition into physical values, such as coupling strength values and qubit bias values, which can be programmed into quantum processor 150a. Initialization module 140 may then be configured to send the appropriate signals along one or more internal buses 106 into NIC 124. NIC 124, in turn, may be configured to send such commands to qubit control system 162 and coupling device control system 164.

For any given problem, evolution module 142 may be configured to determine the appropriate values, at each point in time for the duration of the computation, of coupling $J_{ij}$ for coupling devices 174 and values of local bias $h_i$ for interconnected qubits 172 to fulfill some predetermined evolution schedule (i.e. the schedule for how the evolution is to take place). Once determined, the appropriate coupling device values and local bias values for an evolution schedule are sent as signals, via one or more buses 106, to NIC 124. NIC 124, in turn, is configured to send such commands to quantum device control system 162 and coupling device control system 164.

The computation of analog processor 150 may be configured to operate as, for example, an adiabatic evolution or an annealing evolution. An adiabatic evolution is the evolution used in adiabatic analog computing, and evolution module 142 may be configured to evolve the state of the analog processor 150 in accordance with the evolution used in adiabatic quantum computation. See, e.g., U.S. Patent Publication Nos. 2005-0256007, 2005-0250651, and 2005-0224784 each titled "Adiabatic Quantum Computation with Superconducting Qubits." Annealing is another form of evolution applicable to some analog processors 150, and evolution module 142 may be configured to evolve the state of analog processor 150 in accordance with annealing evolution.

Quantum processor 150a may be configured to solve a quantum problem based on signals provided by initialization module 140 and evolution module 142. Once the problem has been solved, the solution to the problem may be measured from the states of interconnected qubits 172 by readout device 160. Output module 144 may be configured in conjunction with readout device 160 to read this solution.

System memory 126 may further include a driver module 146 configured to output signals to analog processor 150. NIC 124 may be configured to interface with interconnected qubits 172 and coupling devices 174, either directly or through readout device 160, qubit control system 162, and/or coupling device control system 164. Alternatively, NIC 124 may include software and/or hardware that translates commands from driver module 146 into signals (e.g., voltages, currents) that are directly applied to interconnected qubits 172 and coupling devices 174. In an embodiment, NIC 124 may include software and/or hardware for translating signals (representing a solution to a problem or some other form of feedback) from interconnected qubits 172 and the coupling devices 174 such that output module 144 can interpret them. In some embodiments, initialization module 140, evolution module 142, and/or output module 144 may communicate with driver module 146, rather than directly with NIC 124, to send and receive signals from analog processor 150.

The functionality of NIC 124 can be divided into two classes: data acquisition and control. Different types of chips may be used to handle each discrete functional class. Data acquisition is used to measure physical properties of interconnected qubits 172 after quantum processor 150a has completed a computation. Such data can be measured using any number of customized or commercially available data acquisition micro-controllers including data acquisition cards manufactured by Elan Digital Systems (Fareham, UK) including the AD132, AD136, MF232, MF236, AD142, AD218, CF241 cards, and the like. Alternatively, a single type of microprocessor, such as the Elan D403C or D480C, may handle data acquisition and control. There may be multiple NICs 124 in order to provide sufficient control over interconnected qubits 172 and coupling devices 174 and in order to measure the results of a quantum computation on quantum processor 150a.

Computer 102 may further be configured for receiving a computational problem and transmitting the solution of a computational problem processed by analog processor 150 to another system, such as via a telephone modem, a wireless modem, a local area network (LAN) connection, a wide area network (WAN) connection, a portable digital data device, and the like. Computer 102 may be configured to generate a carrier wave embodying a data signal, with the solution to the computational problem processed by analog processor 150 embedded therein.

Analog processor 150 may be in the form of a superconducting quantum computer, examples of which include qubit registers, readout devices, and ancillary devices. Superconducting quantum computers normally are operated at milliKelvin temperatures and often are operated in a dilution refrigerator. An example of a dilution refrigerator is the Leiden Cryogenics B.V. MNK 126 series (Galgewater No. 21, 2311 VZ Leiden, The Netherlands). All or part of the components of quantum processor 150a may be housed in a dilution refrigerator. For example, qubit control system 162 and coupling device control system 164 may be housed outside a dilution refrigerator with the remaining components of quantum processor 150a being housed inside a dilution refrigerator.

Receiver 130, quantum processor interface 134a, and driver module 146, or any combination thereof, may be implemented via existing software packages. Suitable software packages include, for example, MATLAB (The MathWorks, Natick, Mass.), LabVIEW (National Instruments, Austin, Tex.), Maple (Waterloo Maple Inc., Waterloo, Ontario, Canada.), Mathematica (Wolfram Research, Inc., Champaign, Ill.), and the like.

In an embodiment, receiver 130 may be configured to receive a computational problem processing request, and to provide identity information indicative of an entity responsible (e.g., financially responsible) for the received computational problem processing request.

In an embodiment, the present systems, devices, and methods may be implemented as a computer program product that includes a computer program mechanism embedded in a computer readable storage medium. For example, the computer program product may include aspects of the quantum processor interface 134a, operating system 128, receiver 130, pre-processing manager 132, post-processing manager 136 and the like. Aspects of the various interfaces, managers, and modules, may be stored on a CD-ROM, DVD, magnetic disk storage product, any other computer readable data or program storage product, and may also be distributed electronically, via the Internet or otherwise, by transmission of a computer data signal (in which the software modules are embedded) embodied in a carrier wave, and the like.

In an embodiment, the problem-solving system 100 may include a microprocessor 110, a receiver 130, a pre-processing manager 136 and a quantum processor interface 134a. Receiver 130 may be configured to receive a computational problem processing request and provide identity information indicative of an entity responsible for the received computational problem processing request. Quantum processor interface 134a may be configured to convert the computational problem processing request into a series of instructions receivable by quantum processor 150a, to obtain a solution to the computational problem processing request, and/or to send a solution to the computational problem.

In other embodiments, problem-solving system 100 may include additional processors 110 configured to store execution data including processing variables, solution parameters, simulation trajectories, checkpoints, and the like throughout the processing of a computational problem processing request. For example, by storing execution data at predetermined times or after predetermined acts, it may be possible to return problem-solving system 100 to a predetermined point or checkpoint. Storing the execution data at predetermined times may include, for example, storing the execution data at regular intervals or according to a user-determined schedule.

In an embodiment, in the event that problem-solving system 100 experiences a power loss, and/or an application or the operating system stops performing its expected function and/or portions of an application or the operating system stop responding to other parts of the system, stored processing variables, solution parameters, simulation trajectories, and/or checkpoints, and the like may be used to return problem-solving system 100 to a predetermined point or checkpoint.

Interconnected Topology

A complete graph with n vertices (denoted $K_n$) is a graph with n vertices in which each vertex is connected to each of the others (with one edge between each pair of vertices). In some embodiments the edge between each pair of vertices may be connected, empty or weighted.

Figure 2A:
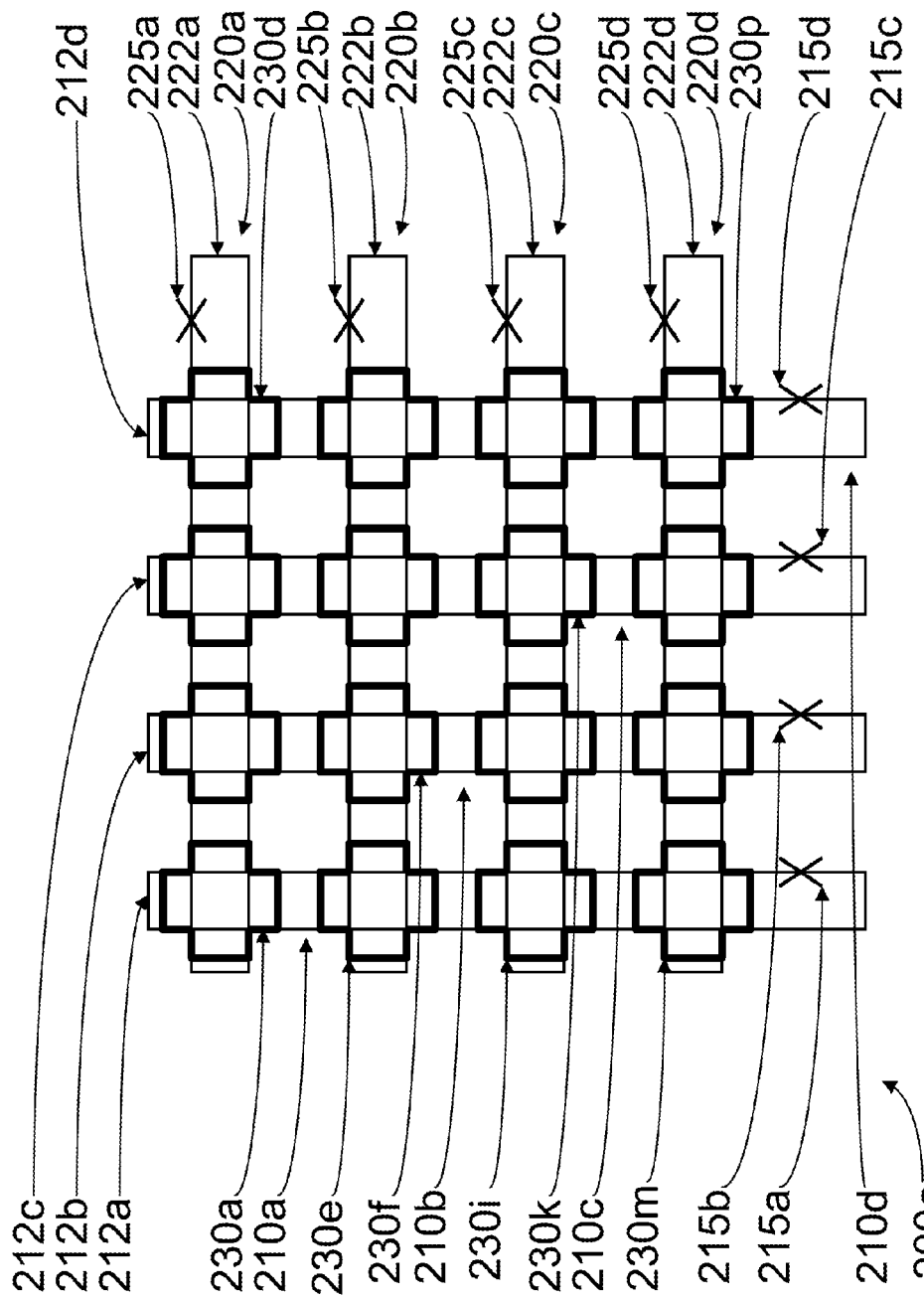
FIG. 2A is a diagram showing systems for solving computational problems according to an illustrative embodiment.

FIG. 2A shows a topology 200a which may include qubits 210a-d (collectively 210) and qubits 220a-d (collectively 220). Qubits 210 are laid out vertically in FIG. 2A and qubits 220 are laid out horizontally in FIG. 2A. A person of skill in the art will appreciate that while four qubits are illustrated both horizontally and vertically, this number is arbitrary and embodiments may comprise more or less than four qubits. Qubits 210, 220 may be superconducting qubits. Crosstalk between qubits 210 and qubits 220 may not exist in some embodiments of the present systems and methods. For crosstalk, or the unintended coupling of qubits, to exist, two current carrying wires from two respective qubits must run parallel in some manner to allow flux from current within a first wire to induce a current to flow in a second wire. Since qubits 210 and qubits 220 run perpendicular to one another, crosstalk between qubits 210 and qubits 220 may be limited. Hence, while qubits 210 and qubits 220 may be proximate to each other, no coupling will exists between pairs of qubits from qubits 210 and qubit 220 if not by through a third structure. Each qubit 210a-d may be a respective loop of superconducting material 212a-d interrupted by at least one respective Josephson junction 215a-d. Each qubit 220a-d may be a respective loop of superconducting material 222a-d interrupted by at least one respective Josephson junction 225a-d. Couplers 230a-230p (collectively 230) couple qubits 210, 220. Each qubit 210a-d is coupled to each qubit 220a-d through four respective couplers from couplers 230 in a region proximate to where a portion of each qubit 210a-d crosses a portion of qubit 220a-d. Each coupler 230a-p may be a respective loop of superconducting material wherein the loop or superconducting material may define a perimeter to a coupling region. Each coupler 230a-p may be a respective loop of superconducting material interrupted by at least one respective Josephson junction wherein the loop or superconducting material may define a perimeter to a coupling region wherein coupling occurs along the perimeter by having a current carrying wire, such as loop of superconducting material 212a-d, 222a-d, run parallel in some manner to coupler 230a-p to allow flux from current within loop of superconducting material 212a-d, 222a-d to induce a current to flow in a coupler 230a-p and vice versa. Couplers 230 may be tunable in that the coupling couplers 230 create between two respective qubits 210, 220 can be changed during the operation of an analog processor. The coupling may change during computation. The coupling may change between computations to embed a problem into the analog processor.

Figure 2B:
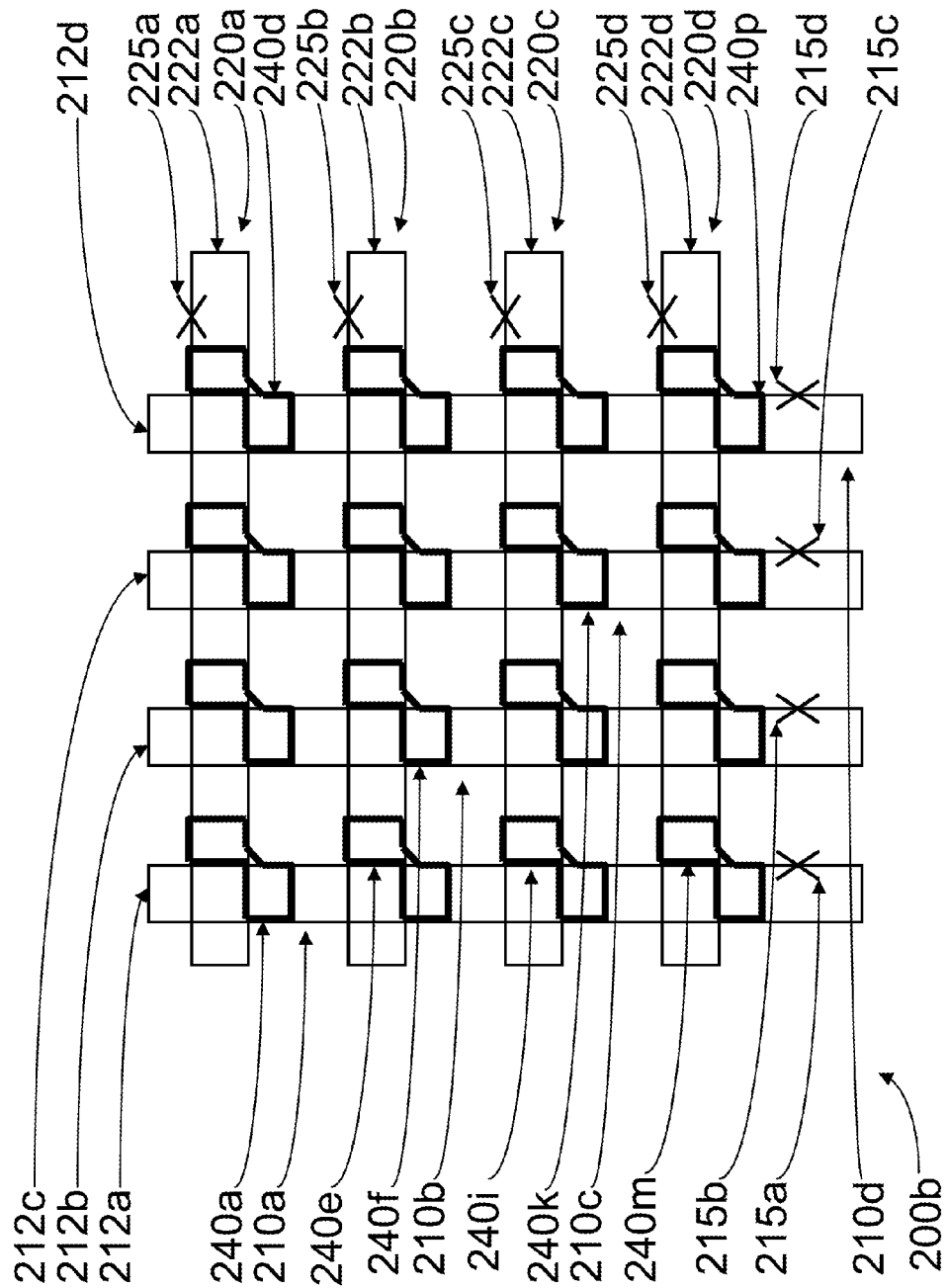
FIG. 2B is a diagram showing systems for solving computational problems according to an illustrative embodiment.

FIG. 2B shows a topology 200B which may include qubits 210a-d (collectively 210) and qubits 220a-d (collectively 220). Qubits 210 are laid out vertically in FIG. 2B and qubits 220 are laid out horizontally in FIG. 2B. A person of skill in the art will appreciate that while four qubits are illustrated both horizontally and vertically, this number is arbitrary and embodiments may comprise more or less than four qubits. Qubits 210, 220 may be superconducting qubits. Crosstalk between qubits 210 and qubits 220 may not exist in some embodiments of the present systems and methods. For crosstalk, or the unintended coupling of qubits, to exist, two current carrying wires from two respective qubits must run parallel in some manner to allow flux from current within a first wire to induce a current to flow in a second wire. Since qubits 210 and qubits 220 run perpendicular to one another, crosstalk between qubits 210 and qubits 220 may be limited. Hence, while qubits 210 and qubits 220 may be proximate to each other, no coupling will exists between pairs of qubits from qubits 210 and qubit 220 if not by through a third structure. Each qubit 210a-d may be a respective loop of superconducting material 212a-d interrupted by at least one respective Josephson junction 215a-d. Each qubit 220a-d may be a respective loop of superconducting material 222a-d interrupted by at least one respective Josephson junction 225a-d. Couplers 240a-240p (collectively 240) couple qubits 210, 220. Each qubit 210a-d is coupled to each qubit 220a-d through four respective couplers from couplers 240 in a region proximate to where a portion of each qubit 210a-d crosses a portion of qubit 220a-d. Each coupler 240a-p may be a respective loop of superconducting material wherein the loop or superconducting material may define a perimeter to a coupling region, the perimeter having two arms: a first arm extending substantially parallel to a respective qubit of qubits 210, and a second arm extending substantially parallel to a respective qubit of qubits 220. The perimeter may or may not encompass a part of the portions a respective pair of qubits 210 and qubits 220 that cross one another. Each coupler 240a-p may be a respective loop of superconducting material interrupted by at least one respective Josephson junction wherein the loop or superconducting material may define a perimeter to a coupling region wherein coupling occurs along the perimeter by having a current carrying wire, such as loop of superconducting material 212a-d, 222a-d, run parallel in some manner to coupler 230a-p to allow flux from current within loop of superconducting material 212a-d, 222a-d to induce a current to flow in a coupler 230a-p and vice versa. Couplers 240 may be tunable in that the coupling couplers 240 create between two respective qubits 210, 220 can be changed during the operation of an analog processor. The coupling may change during computation. The coupling may change between computations to embed a problem into the analog processor.

Figure 3:
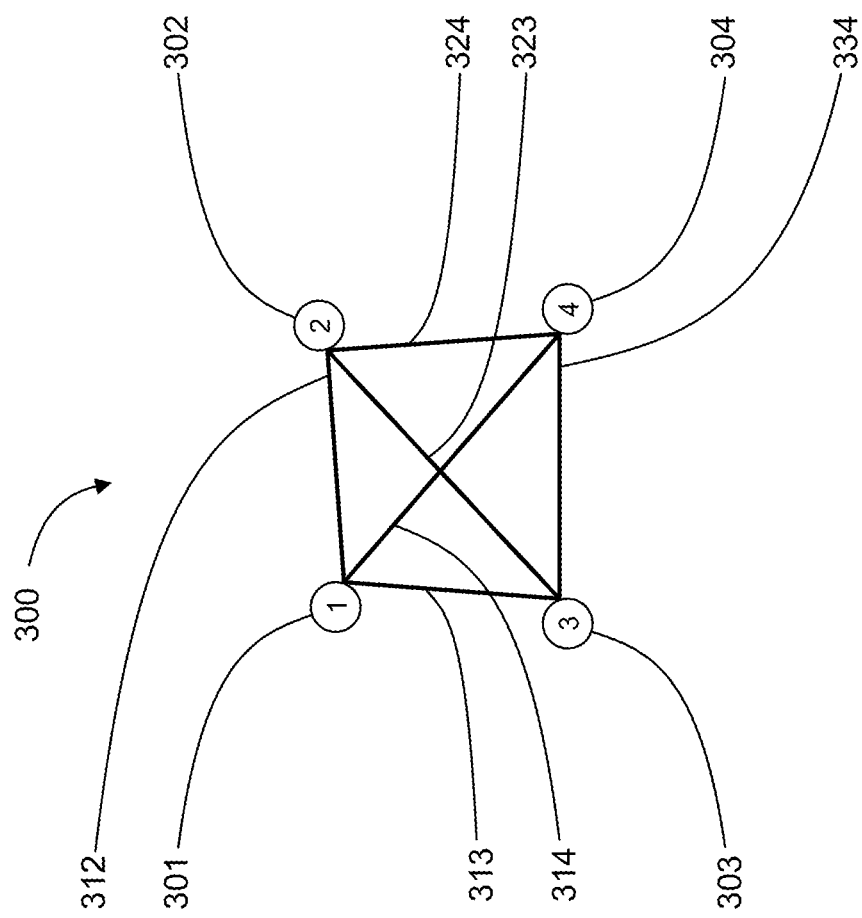
FIG. 3 is a diagram of a source graph.

Couplers 230, 240 may mark the vertices of a grid defined by the qubits 210 and 220 and exist where qubits 210, 220 are proximate to each other thereby facilitating efficient coupling. By ferromagnetically coupling along diagonal couplers 230a, 230f, 230k, 230p or couplers 240a, 240f, 240k, 240p a fully connected $K_4$ graph 300, such as is shown in FIG. 3, can be embedded into topology 200a, 200b. In one embodiment, node 301 may be embedded into qubits 210a, 220a where coupler 230a, 240a ferromagnetically couples qubits 210a, 220a together such that the state of qubit 210a is the same state as the state of qubit 220a. Node 302 may be embedded into qubits 210b, 220b where coupler 230f, 240f ferromagnetically couples qubits 210b, 220b together such that the state of qubit 210b is the same state as the state of qubit 220b. Node 303 may be embedded into qubits 210c, 220c where coupler 230k, 240k ferromagnetically couples qubits 210c, 220c together such that the state of qubit 210c is the same state as the state of qubit 220c. Node 304 may be embedded into qubits 210d, 220d where coupler 230p, 240p ferromagnetically couples qubits 210d, 220d together such that the state of qubit 210d is the same state as the state of qubit 220d. Edge 312 may be embedded into coupler 230b, 230e or 240b, 240e. Edge 313 may be embedded into coupler 230c, 230i or 240c, 240i. Edge 314 may be embedded into coupler 230d, 230m or 240d, 240m. Edge 323 may be embedded into coupler 230g, 230j or 240g, 240j. Edge 324 may be embedded into coupler 230h, 230n or 240h, 240n. Edge 334 may be embedded into coupler 230l, 230o or 240l, 240o.

Topology 200a, 200b may be laid out into an analog computer chip. The analog computer chip may be multi-layered. There may be at least two layers of metal in the analog computer chip. Loops of superconducting material 212a-d may be laid out within a lower metal layer of the analog computer chip. Loops of superconducting material 222a-d may be laid out in an upper metal layer of the analog computer chip. Couplers 230a-p, 240a-p may exist in both the upper metal layer and the lower metal layer. Couplers 230a-p, 240a-p may exist in the upper metal layer when proximate to qubits 210a-d and may exist in the lower metal layer when proximate to qubits 220a-d. Vias may be used within couplers 230a-p, 240a-p to bridge the upper metal layer and the lower metal layer.

Topology 200a may be laid out in another multi-layered analog computer chip such that loops of superconducting material 212a-d may be laid out within a lower metal layer, couplers 230a-p, 240a-p may exist in both an upper and lower metal layer, and loops of superconducting material 222a-d may be laid out in both the upper metal layer and the lower metal layer. Loops of superconducting material 220a-d may exist primarily in the lower metal but may, through the use of vias, exist in the upper metal layer when becoming proximate to loops of superconducting material 210a-d. There may exist additional metal layers which may be used for shielding within analog computer chips.

Examples of superconducting qubits include superconducting flux qubits, superconducting charge qubits, and the like. See e.g., Makhlin et al., 2001, *Reviews of Modern Physics* 73, pp. 357-400. Examples of flux qubits that may be used include rf-SQUIDs, which include a superconducting loop interrupted by one Josephson junction, persistent current qubits, which include a superconducting loop interrupted by three Josephson junctions, and the like. See e.g., Mooij et al., 1999, *Science* 285, 1036; and Orlando et al., 1999, *Phys. Rev. B* 60, 15398. Other examples of superconducting qubits can be found, for example, in Il'ichev et al., 2003, *Phys. Rev. Lett.* 91, 097906; Blatter et al., 2001, *Phys. Rev. B* 63, 174511, and Friedman et al., 2000, *Nature* 406, 43. In addition, hybrid charge-phase qubits may also be used.

In some embodiments quantum devices are flux qubits which are loops of superconducting material. The actual shape of the loop is not important. This means that a roughly circular loop is no better or worse than an elongated "skinny" loop.

On-chip control circuitry may be laid out efficiently within areas within the grid defined by the qubits 210 and 220. Examples of on-chip control circuitry can be found in U.S. Patent Application Publication No. 2008-0215850, U.S. patent application Ser. No. 12/109,847, U.S. patent application Ser. No. 12/120,354, and U.S. patent application Ser. No. 12/236,040.

Examples of interconnected topologies include U.S. Patent Application Publication No. 2006-0225165, U.S. Patent Application Serial No. 2008-0176750, and U.S. patent application Ser. No. 12/266,378.

Qubits 210, 220 interact. This is done by creating a mutual inductance between a qubit 210, 220 and coupler 230, 240. This mutual inductance takes up significant physical space on the chip on which topology 200a, 200b is laid, and a significant fraction of total qubit wire length.

Generally qubits with shorter and narrower wires increase the ratio of inductance-to-capacitance (at a given $\beta_L$), where the ratio of inductance-to-capacitance of a qubit determines the quantum level spacing of the qubit. $\beta_L$ may be defined as $\beta_L = 2\pi L I_c^l / \Phi_0$, where L is the inductance of each respective qubit, $I_c^l$ is the critical current of each respective qubit and $\Phi_0$ is the magnetic flux quantum. The further the levels are spaced, the more distinguishable the quantum effects exhibited by the qubit are. Processors with qubits that have higher connectivity are considered more powerful (for a given number of qubits), but qubits with higher connectivities inherently have reduced quantum level spacings.

U.S. Patent Application Publication No. 2006-0225165 and U.S. patent application Ser. No. 12/266,378 use relatively small qubits and large couplers. Analog and quantum processor topologies may use relatively large qubits and small couplers to produce quantum systems with increased quantum effects. Each qubit may have a $\beta_L$ (which is proportional to the inductance of the qubit multiplied by the critical current of the qubit) of about 3.5, whereas each coupler may have a $\beta_L$ between 1 and 1.5. At identical line widths and Josephson junction size, qubits should be about 3 times the physical size of couplers to promote quantum effects within analog processor topologies. Qubits may be made larger by also increasing their line width thereby adding unneeded capacitance which decreases the qubit's ratio of inductance-to-capacitance thereby reducing the quantum effects exhibited by the qubit. Couplers can be made longer by the same means, which therein reduces their respective ratio of inductance-to-capacitance.

The present devices, systems and methods allow for qubits with short pieces of wire and small Josephson junctions (translating to a large inductance-to-capacitance ratio). Couplers are put wherever qubits cross or touch and extending couplers on top of the qubits for as long a distance as is needed may produce the desired mutual inductance and $\beta_L$ for couplers and qubits.

Ferromagnetic coupling implies that parallel fluxes are energetically favorable and anti-ferromagnetic coupling implies that anti-parallel fluxes are energetically favorable. Examples of coupling devices can be found, for example, in U.S. Patent Application Publication No. 2006-0147154, U.S. Patent Application Publication No. 2008-0238531, U.S. Patent Application Publication No. 2008-0274898, U.S. patent application Ser. No. 12/238,147, and U.S. patent application Ser. No. 12/242,133. Alternatively, charge-based coupling devices may also be used.

Figure 4:
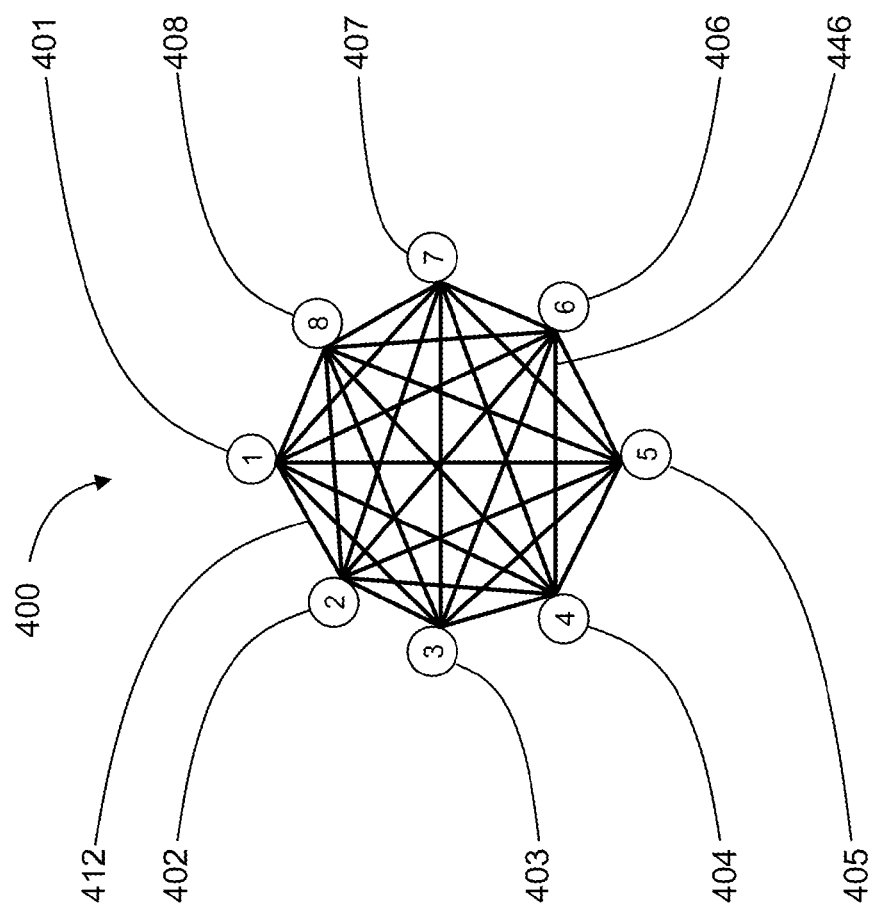
FIG. 4 is a diagram of a source graph.
Figure 5:
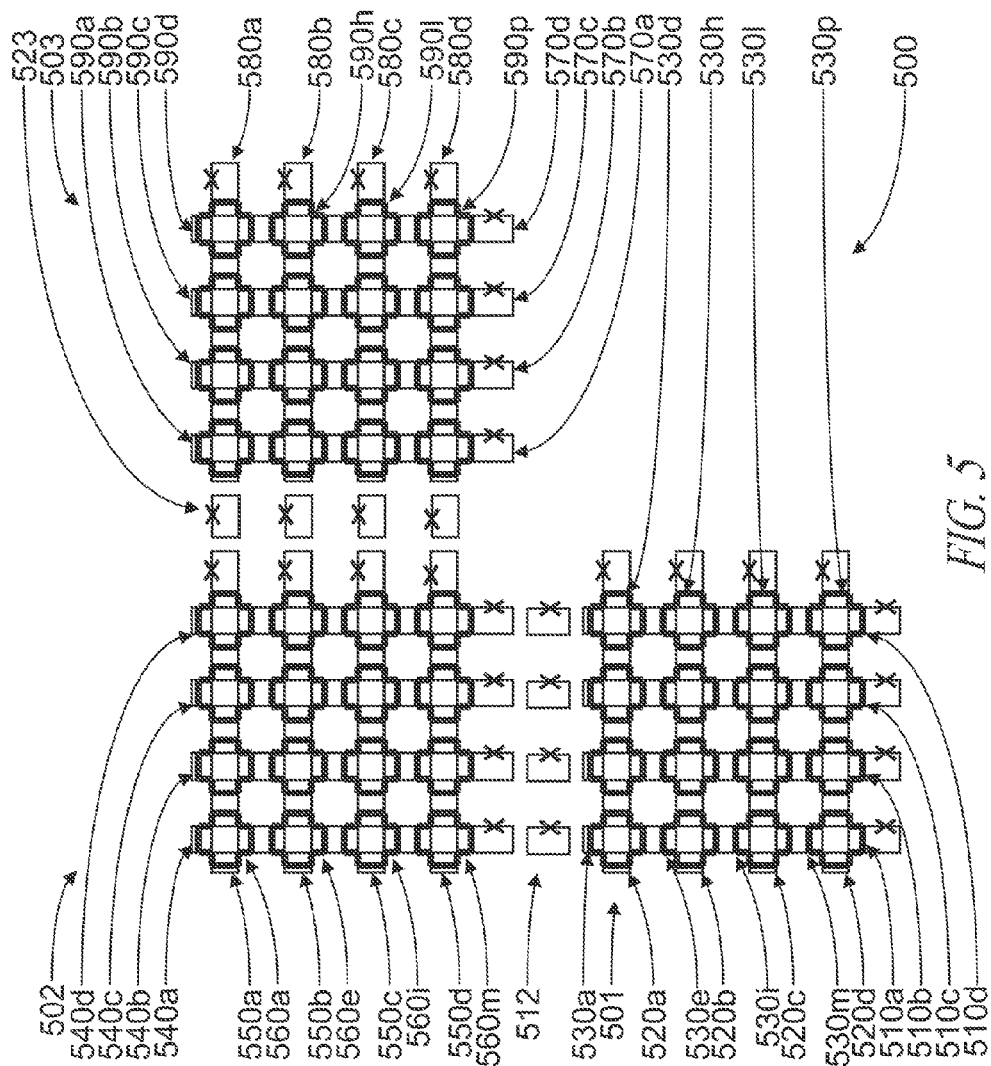
FIG. 5 is a diagram showing systems for solving computational problems according to an additional illustrative embodiment.

FIG. 4 shows a fully connected $K_8$ source graph 400 wherein each node in the source graph is connected to every other node in the source graph by an edge. FIG. 5 shows a topology 500. Topology 500 includes three subtopologies 501, 502, 503 where all subtopologies are similar to topology 200a. Topology 500 may include subtopologies similar to topology 200b.

Subtopologies 501, 503 may be used to embed two distinct $K_4$ graphs. Subtopology 502 may be used to encode a bipartite graph where a bipartite graph is a graph whose vertices or nodes can be divided into two disjoint sets $V_1$ and $V_2$ such that every edge in the bipartite graph connects a node in $V_1$ and a node in $V_2$; that is, there is no edge between two nodes in the same set. Subtopology 502 may embed a complete bipartite graph such that there exists an edge between each node in $V_1$ and each node in $V_2$, where each node in $V_1$ is associated with nodes embedded into subtopology 501 and each nodes in $V_2$ is associated with nodes embedded into subtopology 503.

Subtopology 501 may include qubits 510a-d (collectively 510) and qubits 520a-d (collectively 520). Qubits 510 are laid out vertically and qubits 520 are laid out horizontally. Qubits 510, 520 may be superconducting qubits. Each qubit 510a-d may be a respective loop of superconducting material interrupted by at least one respective Josephson junction. Each qubit 520a-d may be a respective loop of superconducting material interrupted by at least one respective Josephson junction. Couplers 530a-530p (collectively 530) couple qubits 510, 520. Each qubit 510a-d is coupled to each qubit 520a-d through four respective couplers from couplers 530. Each coupler 530a-p may be a respective loop of superconducting material. Each coupler 530a-p may be a respective loop of superconducting material interrupted by at least one respective Josephson junction.

Couplers 530 may mark the vertices of a grid defined by the qubits 510 and 520 and exist where qubits 510, 520 are proximate to each other thereby facilitating efficient coupling. By ferromagnetically coupling along diagonal couplers 530a, 530f, 530k, 530p a fully connected $K_4$ graph can be embedded into subtopology 501. In one embodiment, node 401 may be embedded into qubits 510a, 520a where coupler 530a ferromagnetically couples qubits 510a, 520a together such that the state of qubit 510a is the same state as the state of qubit 520a. Node 402 may be embedded into qubits 510b, 520b where coupler 530f ferromagnetically couples qubits 510b, 520b together such that the state of qubit 510b is the same state as the state of qubit 520b. Node 403 may be embedded into qubits 510c, 520c where coupler 530k ferromagnetically couples qubits 510c, 520c together such that the state of qubit 510c is the same state as the state of qubit 520c. Node 404 may be embedded into qubits 510d, 520d where coupler 530p ferromagnetically couples qubits 510d, 520d together such that the state of qubit 510d is the same state as the state of qubit 520d. Edge 412 may be embedded into coupler 530b, 530e. Edge 413 may be embedded into coupler 530c, 530i. Edge 414 may be embedded into coupler 530d, 530m. Edge 423 may be embedded into coupler 530g, 530j. Edge 424 may be embedded into coupler 530h, 530n. Edge 434 may be embedded into coupler 530l, 530o.

Subtopology 503 may include qubits 570a-d (collectively 570) and qubits 580a-d (collectively 580). Qubits 570 are laid out vertically and qubits 580 are laid out horizontally. Qubits 570, 580 may be superconducting qubits. Each qubit 570a-d may be a respective loop of superconducting material interrupted by at least one respective Josephson junction. Each qubit 580a-d may be a respective loop of superconducting material interrupted by at least one respective Josephson junction. Couplers 590a-590p (collectively 590) couple qubits 570, 580. Each qubit 570a-d is coupled to each qubit 580a-d through four respective couplers from couplers 590. Each coupler 590a-p may be a respective loop of superconducting material. Each coupler 590a-p may be a respective loop of superconducting material interrupted by at least one respective Josephson junction.

Couplers 590 may mark the vertices of a grid defined by the qubits 570 and 580 and exist where qubits 570, 580 are proximate to each other thereby facilitating efficient coupling. By ferromagnetically coupling along diagonal couplers 590a, 590f, 590k, 590p a fully connected $K_4$ graph can be embedded into subtopology 503. In one embodiment, node 405 may be embedded into qubits 570a, 580a where coupler 590a ferromagnetically couples qubits 570a, 580a together such that the state of qubit 570a is the same state as the state of qubit 580a. Node 406 may be embedded into qubits 570b, 580b where coupler 590f ferromagnetically couples qubits 570b, 580b together such that the state of qubit 570b is the same state as the state of qubit 580b. Node 407 may be embedded into qubits 570c, 580c where coupler 590k ferromagnetically couples qubits 570c, 580c together such that the state of qubit 570c is the same state as the state of qubit 580c. Node 408 may be embedded into qubits 570d, 580d where coupler 590p ferromagnetically couples qubits 570d, 580d together such that the state of qubit 570d is the same state as the state of qubit 580d. Edge 456 may be embedded into coupler 590b, 590e. Edge 457 may be embedded into coupler 590c, 590i. Edge 458 may be embedded into coupler 590d, 590m. Edge 467 may be embedded into coupler 590g, 590j. Edge 468 may be embedded into coupler 590h, 590n. Edge 478 may be embedded into coupler 590l, 590o.

Subtopology 502 may include qubits 540a-d (collectively 540) and qubits 550a-d (collectively 550). Qubits 540 are laid out vertically and qubits 550 are laid out horizontally. Qubits 540, 550 may be superconducting qubits. Each qubit 540a-d may be a respective loop of superconducting material interrupted by at least one respective Josephson junction. Each qubit 550a-d may be a respective loop of superconducting material interrupted by at least one respective Josephson junction. Couplers 560a-560p (collectively 560) couple qubits 540, 550. Each qubit 540a-d is coupled to each qubit 550a-d through four respective couplers from couplers 560. Each coupler 560a-p may be a respective loop of superconducting material. Each coupler 560a-p may be a respective loop of superconducting material interrupted by at least one respective Josephson junction. Each qubit 540a-d may be coupled ferromagnetically or anti-ferromagnetically to a corresponding qubit from qubits 510a-d such that qubit 510a is coupled to 540a thereby embedding node 401 into qubit 540a, qubit 510b is coupled to 540b thereby embedding node 402 into qubit 540b, qubit 510c is coupled to 540c thereby embedding node 403 into qubit 540c, and qubit 510d is coupled to 540d thereby embedding node 404 into qubit 540d. Each qubit 550a-d may be coupled ferromagnetically or anti-ferromagnetically to a corresponding qubit from qubits 580a-d such that qubit 580a is coupled to 550a thereby embedding node 405 into qubit 550a, qubit 580b is coupled to 550b thereby embedding node 406 into qubit 550b, qubit 580c is coupled to 550c thereby embedding node 407 into qubit 550c, and qubit 580d is coupled to 550d thereby embedding node 408 into qubit 550d. Inter-subtopology coupling may be achieved with couplers 512, 523. Couplers 512 may be a series of coupling devices capable of coupling qubits 510 of subtopology 501 to qubits 540 of subtopology 502. Couplers 523 may be a series of coupling devices capable of coupling qubits 550 of subtopology 502 to qubits 580 of subtopology 503. Each coupler 512, 523 may be a respective loop of superconducting material. Each coupler 512, 523 may be a respective loop of superconducting material interrupted by at least one respective Josephson junction.

There may exist inter-subtopology couplers which do not couple linear distances between qubits two sub-topologies. Rather, there may exist corner couplers which couple together pairs of qubits of two different sub-topologies which run perpendicular to one another, and the corner coupler couples these two perpendicular qubits by having an about 90 degree corner in the coupler length.

Couplers 560 may mark the vertices of a grid defined by the qubits 540 and 550 and exist where qubits 540, 550 are proximate to each other thereby facilitating efficient coupling. Edge 415 may be embedded into coupler 560a. Edge 425 may be embedded into coupler 560b. Edge 435 may be embedded into coupler 560c. Edge 445 may be embedded into coupler 560d. Edge 416 may be embedded into coupler 560e. Edge 426 may be embedded into coupler 560f. Edge 436 may be embedded into coupler 560g. Edge 446 may be embedded into coupler 560h. Edge 417 may be embedded into coupler 560i. Edge 427 may be embedded into coupler 560j. Edge 437 may be embedded into coupler 560k. Edge 447 may be embedded into coupler 560l. Edge 418 may be embedded into coupler 560m. Edge 428 may be embedded into coupler 560n. Edge 438 may be embedded into coupler 560o. Edge 448 may be embedded into coupler 560p.

One may embed graphs with higher numbers of nodes by adding additional $K_4$ and complete bipartite graphs to topology 500. By creating two topologies 500 and a bipartite graph made of four subtopologies 503 arranged in a 2×2 square, a complete $K_{16}$ graph may be embedded.

The graphs embedded into topologies 200a, 200b, 500 need not be complete. Sparsely filed graphs may also be embedded into larger topologies.

Figure 6:
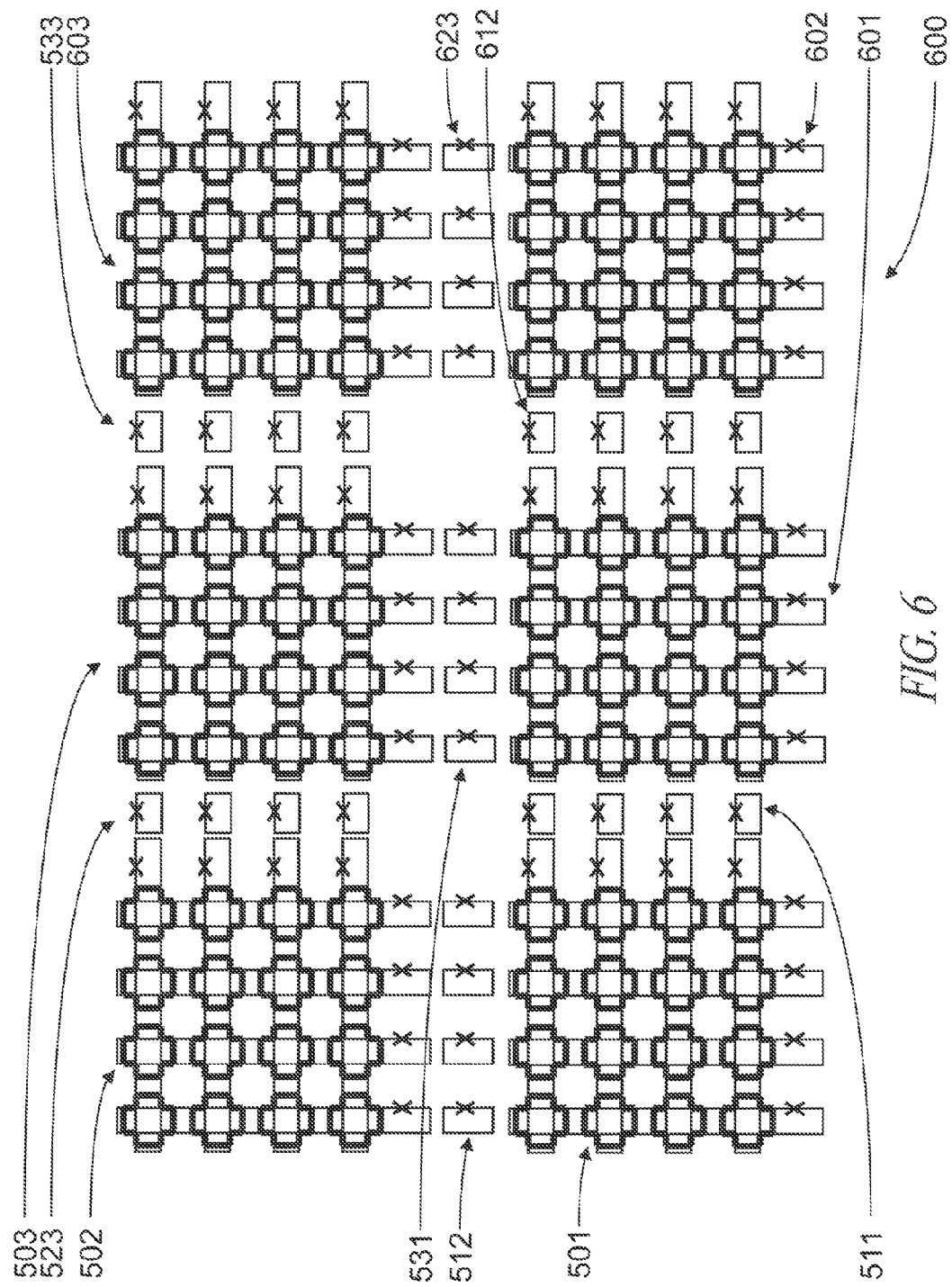
FIG. 6 is a diagram showing systems for solving computational problems according to a further illustrative embodiment.

FIG. 6 shows topology 600. Topology 600 comprises sub-topologies 601, 602, 603 in addition to subtopologies 501, 502, 503 from FIG. 5. Inter-subtopology couplers 511, 512, 523, 531, 533, 612, 623 may also be located within topology 600. Subtopologies 501, 503 are coupled to subtopologies 601, 603 through couplers 511, 531, 533 such that a 2x$K_8$ graph can be embedded into topology 600. Each $K_8$ graph or portion thereof, such as source graph 400 of FIG. 4, may be coupled to variables from the second $K_8$ graph. One $K_8$ graph may be embedded into subtopologies 501, 502, 503 and a second $K_8$ graph may be embedded into subtopologies 601, 602, 603. The couplers 511, 512, 523, 531, 533, 612, 623 between qubits of subtopologies 501, 503 and subtopologies 601, 603 may be controllable such that both ferromagnetic couplings, anti-ferromagnetic couplings, zero couplings and transverse couplings may be created between pairs of adjacent qubits.

Superconducting Probe Card

The various embodiments described herein provide systems and devices for superconducting probe cards. A superconducting probe card may include at least one superconducting needle that is capable of establishing a superconducting connection with a superconducting integrated circuit. While normal-metal and non-superconducting probe cards are well known in the art (such as those sold by, for example, Wentworth Laboratories, Inc. of 500 Federal Road, Brookfield, Conn. 06804, USA), no previous description or implementation of a superconducting probe card are known by the inventors.

In the operation of an integrated circuit such as integrated circuits incorporating topologies such as those depicted schematically in topologies 200a, 200b, 500, 600, an interface to a separate system of electronics is typically established. Through such an interface, signals may be communicated to/from the integrated circuit for a variety of purposes, including but not limited to: power distribution, communication, system programming, calibration, measurements, system monitoring, circuit control, feedback, calculation, operation, and the like. When communicating with the components of a superconducting integrated circuit ("SIC"), it may be desirable to establish a superconducting communication interface as opposed to a non-superconducting communication interface. A superconducting communication interface can be beneficial in some applications because it can reduce the heat load on the refrigeration system (required to reach superconducting temperatures) and it can reduce the level of signal noise being coupled to the SIC. This latter benefit may be of particular importance in applications involving highly sensitive SICs, such as superconducting processors and/or superconducting quantum processors.

The implementation of a superconducting interface for communicating with a SIC has been seen in the art. A common technique is to wire-bond to the SIC using superconducting wire, such as aluminum wire. For further details of systems involving superconducting wire-bonding, see U.S. patent application Ser. No. 12/016,801.

While effective, manual wire-bonding is a slow and labor-intensive process. The communication interface with a SIC may involve any number of individual communication paths, and applications that include many such paths (i.e., on the order of a hundred or more) may take a long time to manually wire-bond. Furthermore, wire-bonding is a process that cannot be readily undone. As previously stated, in some applications testing, analysis and/or repair may be simplified if the SIC may be easily removed from the system and/or substituted. The implementation of a superconducting probe card allows superconducting connections to the SIC to be made quickly and easily, while still allowing the SIC to be readily removed or replaced.

A probe card is a device designed to quickly provide a communication interface with an integrated circuit. Typical probe cards may include a printed circuit board (PCB) that is communicably connected to a plurality of conductive needles extending therefrom. The conductive needles are arranged such that, when positioned adjacent to the integrated circuit, respective needles of the probe card aligns with a particular component or contact pad on the integrated circuit. The probe card needles may then collectively be brought in contact with the corresponding components or contact pads of the integrated circuit, establishing communicative connections therebetween. Communicative connections may be maintained while the probe card needles remain in contact with corresponding components or contact pads of the integrated circuit. Probe cards are presently available in a wide variety of forms; however, the various embodiments described herein represent the first descriptions of probe cards that are intended to provide superconducting connections to a superconducting integrated circuit at cryogenic temperatures.

Tungsten-3% rhenium is a standard alloy that is typically used to form the needles of a normal-metal probe card in applications requiring non-superconducting connections. This material is often used, at least in part, because it is ductile and durable. Durability is of particular importance in a probe card needle because, in operation, the needle is pressed in firm contact against a component or contact pad in an integrated circuit. Indeed, the pressure is such that the needle often scrapes away a portion of the contact pad. The needle must therefore be durable to survive repeated use and ensure reliable contacts are made in successive uses.

The tungsten-3% rhenium alloy may be capable of superconducting, but only at very low temperatures below 1K. However, as described in Blaugher et al., "*The Superconductivity of Some Intermetallic Compounds*", IBM Journal (1962), pp. 117-118, the critical temperature of the alloy (that is, the temperature below which the alloy superconducts) increases as the proportion of rhenium increases up to about 40%. Thus, in accordance with the present systems and devices, a superconducting probe card is described that employs needles formed of a tungsten-rhenium alloy comprising a substantially greater proportion of rhenium than previously used in the art. In some embodiments, an alloy of tungsten-26% rhenium is used to form the superconducting probe card needles.

A superconducting probe card may be specifically designed to operate around at least one of two temperatures: a system-testing temperature and a full-implementation temperature. Typically, a full-implementation temperature is colder than a system-testing temperature. In system testing, the superconducting probe card may be used to test and analyze a SIC at a temperature that is below the critical temperature of the SIC but that is nevertheless above the temperature at which the SIC would be operated if it was being fully-implemented. A reason for doing this would be to analyze and confirm the superconducting electrical behavior of the SIC before committing the resources to cooling the SIC to the temperature of full-implementation. For example, if the SIC includes a superconducting processor, such as a superconducting quantum processor, then it may be desirable to test the SIC behavior in the superconducting regime before committing to cool the SIC to the milliKelvin environment that is desired for superconducting quantum computation. One of the easiest and fastest ways to cool a device to the superconducting regime is an immersion in a liquid coolant, such as liquid helium. A bath of liquid helium-4 may maintain a temperature of ~4.2K if stored in an insulated dewar. 4.2K is below the critical temperature of some superconducting materials (e.g., lead and niobium) and therefore provides an adequate testing temperature for many SIC applications. Furthermore, a volume of liquid helium-4 may easily be further cooled by evaporative cooling (i.e., pumping helium vapor out of the dewar) to a temperature range of ~1K, which is below the critical temperature of many other superconducting materials (e.g., tin and aluminum). Thus, the superconducting electrical behavior of a SIC may be readily tested by dipping the SIC in a (pumped, if necessary) bath of liquid helium-4.

A superconducting probe card that is implemented for system testing may employ at least one superconducting material that has a critical temperature that is above the base temperature of the refrigeration system in which testing is carried out. For example, a superconducting probe card that is used in a bath of liquid helium-4 may employ at least one superconducting material that has a critical temperature above the temperature of the liquid helium-4. In accordance with the present systems and devices, a superconducting probe card may include needles that are formed of a material that is superconducting in the range of about 1K-5K. As shown in Blaugher et al., this corresponds to a tungsten-rhenium alloy with about 10%-30% rhenium (i.e. tungsten-10% rhenium to tungsten-30% rhenium). Within this range, tungsten-26% rhenium is an alloy that is readily available in wire form because it is commonly used in high-temperature thermocouple devices.

A superconducting probe card that is used when the system is fully-implemented may employ at least one superconducting material that has a critical temperature that is above the base temperature of the refrigeration system employed for full implementation. For example, a superconducting probe card that is used to provide a superconducting communication interface with a superconducting processor, such as a superconducting quantum processor, may employ superconducting materials that have a critical temperature that is above the operation temperature of the superconducting quantum processor. Typically, a superconducting quantum processor may be operated in the milliKelvin range, thus the superconducting probe card should employ superconducting materials that have a critical temperature above this range. Note that the temperature range for system testing is typically higher than the temperature range for full-system implementation, therefore a superconducting probe card that is suitable for system testing temperatures may also be suitable for full-system implementation temperatures, but not necessarily vice versa.

Figure 7:
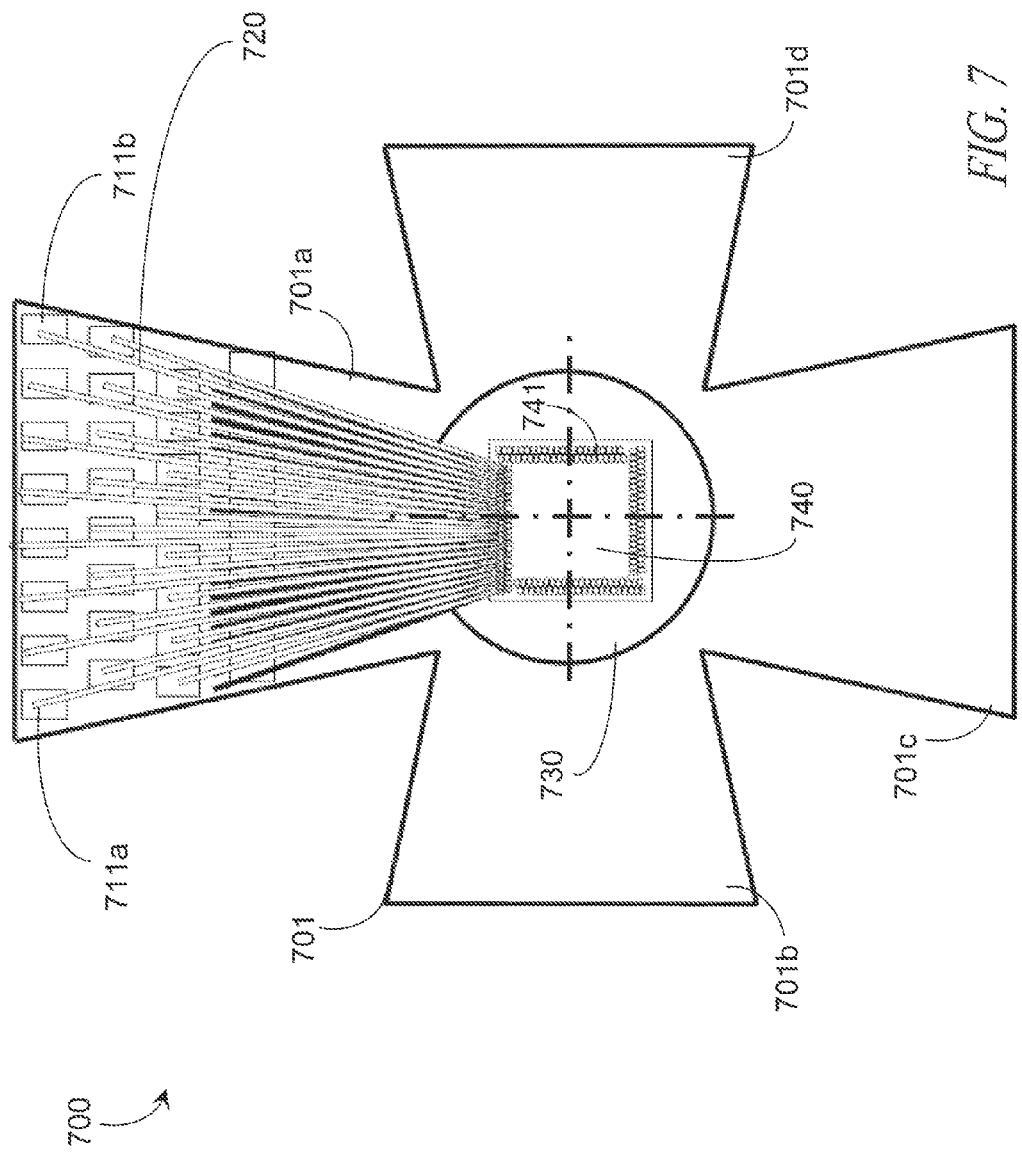
FIG. 7 is a top plan view of a superconducting probe card according to one illustrated embodiment.

FIG. 7 shows a superconducting probe card 700 according to one illustrated embodiment. Probe card 700 includes PCB 701, which in the illustrated embodiment includes four arms 701a-701d. Those of skill in the art will appreciate that, in alternative embodiments, PCB 701 may take on any form or geometry. Though not shown, PCB 701 may include a plurality of superconducting traces, each of which couples to a respective superconducting contact pad 711a, 711b (only two called out in FIG. 7, collectively 711). The superconducting traces (not shown) may be formed directly by a superconducting material, or they may be formed by a non-superconducting material that is plated with a superconducting material. Contact pads 711 may provide connection sites for superconducting needles 720 (only one called out in the Figure). PCB 701 may also includes hole 730 through which superconducting needles 720 may extend to establish superconducting communicative connections with a superconducting device 740. In some embodiments, each of needles 720 may be bent at some point along their respective lengths to extend through hole 730.

The illustrated embodiment of probe card 700 is simplified, showing contact pads 711 and needles 720 connected only to arm 701a and similar structures are not shown connected to arms 701b-701d. This has been done with the intention of reducing clutter in FIG. 7, and those of skill in the art will appreciate that arms 701b-701d may include similar structures and features as those illustrated and described for arm 701a. For similar reasons, the superconducting traces on PCB 701 have been omitted from FIG. 7. Those of skill in the art will appreciate that such traces may be carried by any surface or portion of the insulative material of PCB 701, including inner layers of the PCB 701, and may ultimately provide superconductingly communicative connections to a separate signal distribution system. Furthermore, the illustrated embodiment in FIG. 7 shows some needles as white and some needles as black. In the illustration, black is used to denote needles that are connected to ground on PCB 701 as opposed to respective contact pads 711. However, those of skill in the art will appreciate the probe card 700 may include any number of needles 720, and any corresponding number of ground needles (shown in black), including embodiments with no ground needles, as required by the application.

As previously described, superconducting needles 720 may be formed of a superconducting material that has a critical temperature above the intended operating temperature of superconducting probe card 700. An example of such a material is an alloy of tungsten-rhenium, such as tungsten-26% rhenium. A first end of each of superconducting needles 720 is superconductingly communicably coupled to a respective contact pad 711 on PCB 701. In some embodiments, this coupling is a fixed connection realized by, for example, a solder connection. A second end of each of superconducting needles 720 is superconductingly communicably coupled to a respective contact pad 741 on superconducting device 740. In some embodiments, this coupling may be a free connection that is realized by direct physical contact between each needle tip and a respective one of contact pads 741. Consequently, all of the needle tips may be aligned in a coplanar fashion in some embodiments, where the probe card 700 will be used with a superconducting device 740 that has a set of planar contact pads 741. In other embodiments, the needle tips may be aligned in a non-coplanar fashion, for example where the probe card 700 will be used with a superconducting device 740 that has a set of non-coplanar contact pads 741. In some embodiments, a first set of needle tips may lie in a first plane and a second set of needle tips may lie in a second plane, different from the first plane. In some such embodiments, the first and the second planes may be substantially parallel to one another.

Superconducting device 740 may take on a variety of forms and may include a superconducting integrated circuit. In some embodiments, superconducting device 740 may include a superconducting processor, such as a superconducting quantum processor. Such a superconducting quantum processor may include circuits which look similar to one of topology 200a, 200b, 500, 600. In such embodiments, each of contact pads 741 may be superconductingly communicably coupled to a respective device or component of superconducting quantum processor 740. Examples of devices or components that may be included in superconducting quantum processor 740 include, but are not limited to: superconducting flux qubits, superconducting phase qubits, superconducting charge qubits, superconducting hybrid qubits, superconducting coupling devices, superconducting readout devices, and superconducting on-chip programming devices. Further details of superconducting on-chip programming devices are provided in US Patent Publication 2008-215850.

As previously described, in some embodiments a first end of each of needles 720 may be superconductingly communicably coupled to a respective contact pad 711 on PCB 701 by a solder connection. However, an alloy of tungsten-rhenium is not readily solderable. In the art, tungsten-rhenium (of low rhenium composition) is often used in non-superconducting electrical applications and, when a solder connection is desired, the tungsten-rhenium is plated with a layer of nickel. However, nickel is not a superconducting material, thus in a superconducting probe card such a nickel coating would interrupt the superconductivity of the signal. In accordance with the present systems and devices, at least a portion of each of superconducting needles 720 may be plated with a superconducting material that is solderable, such as zinc.

Figure 8A:
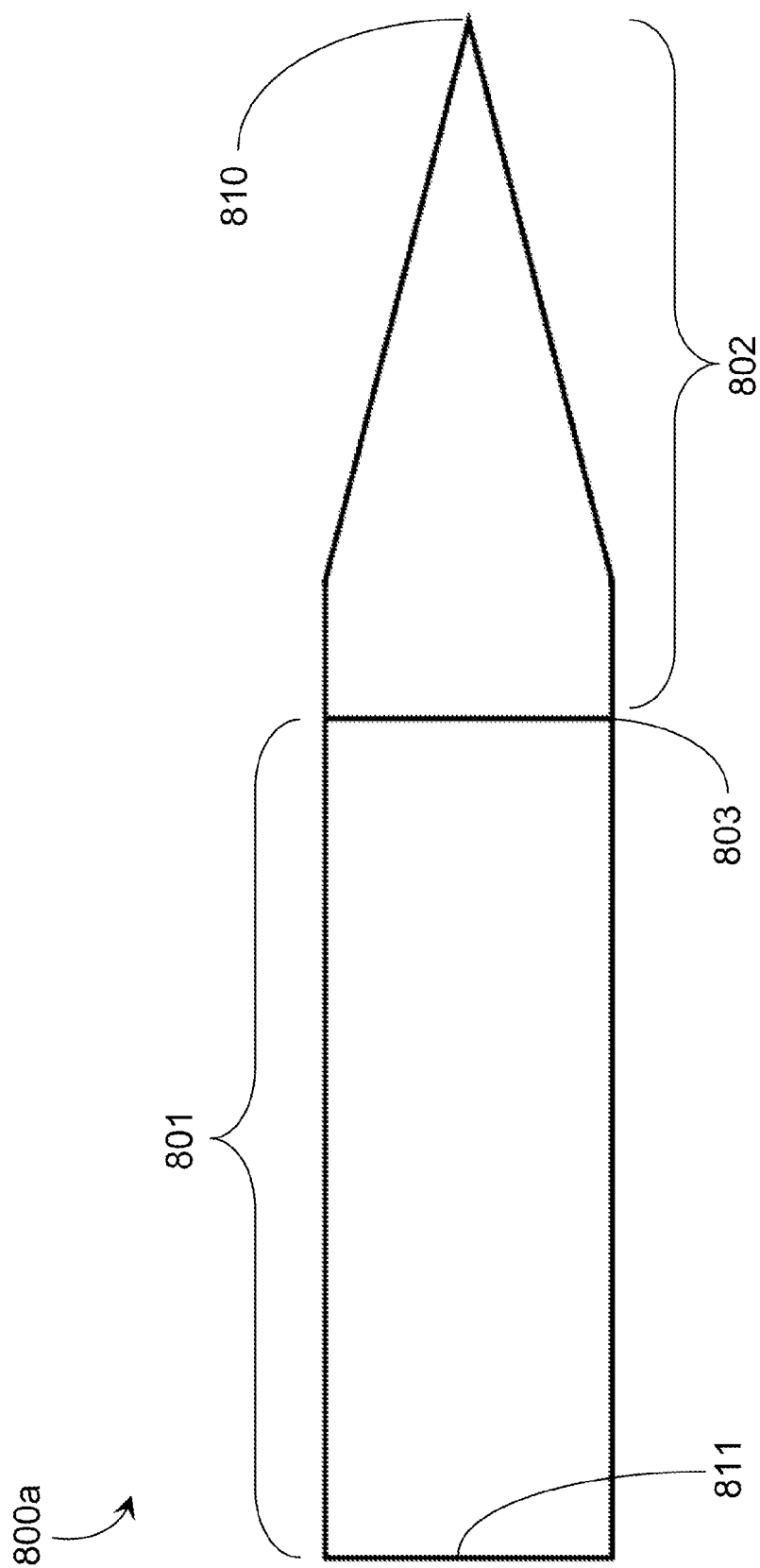
FIG. 8A is a side elevational view of a superconducting needle for use in a superconducting probe card, according to one illustrated embodiment.

FIG. 8A shows a superconducting needle 800a for use in a superconducting probe card, according to one illustrated embodiment. As previously discussed, needle 800a may be formed of a material that is capable of superconducting at a temperature that is at or above the operating temperature of the probe card. For example, needle 800a may be formed of an alloy of tungsten-rhenium, where the critical temperature of the alloy depends on the ratio of tungsten:rhenium in the alloy. Alloys of tungsten-rhenium are well-suited to be used as probe card needles because they are very hard and therefore less likely to be damaged by repeated contacts with SICs. Indeed, alloys of tungsten-rhenium are already used in the art to form probe card needles; however, these applications (see, for example, publication of "Probe Needle Part Number Clarification, Terminology, Tolerances and Material Properties" provided by Point Technologies Inc. at http://www-.pointtech.com/pdf/def_mat_number.pdf) are limited to semiconductor and non-superconducting applications. In accordance with the present systems and devices, needle 800a may be formed of an alloy of tungsten-rhenium that contains a greater proportion of rhenium than previously implemented in the art, for the novel purpose of forming a superconducting probe card.

Superconducting needle 800a includes a main body or shaft 801 and a tapered end 802 ending in a point or needle tip 810. Tapered end 802 is used to establish a physical and superconductingly electrical connection with a contact pad on a superconducting device, such as superconducting device 740 from FIG. 7. Somewhere along the length of shaft 801, and preferably at or close to end 811, needle 800a may be connected (e.g., soldered) to a superconducting contact pad on the PCB portion of a superconducting probe card. In order to facilitate this connection, at least a portion of shaft 801 may be coated with a material that is superconducting and also readily solderable. Zinc is an example of such a material. In some embodiments, the zinc-plating is only used on shaft 801 and not on tapered end 802 or point 810. This defines a border 803 between zinc and tungsten-rhenium on the surface of needle 800a. Those of skill in the art will appreciate that, in alternative embodiments, border 803 may be positioned at a different location relative to end 811, point 810, and tapered end 802 than that shown in FIG. 8A. Those of skill in the art will also appreciate that the relative lengths between shaft 801 and tapered end 802, as shown in FIG. 8A, may vary in alternative embodiments. Needle 800a may be chemically etched to similar specifications as those used for tungsten-rhenium probe card needles for semiconductor and non-superconducting purposes. However, in accordance with the present systems and devices the tungsten-rhenium alloy has a higher proportion of rhenium (e.g. tungsten-26% rhenium) such that the critical temperature of needle 800a is higher than that of typical semiconductor probe card needles.

Figure 8B:
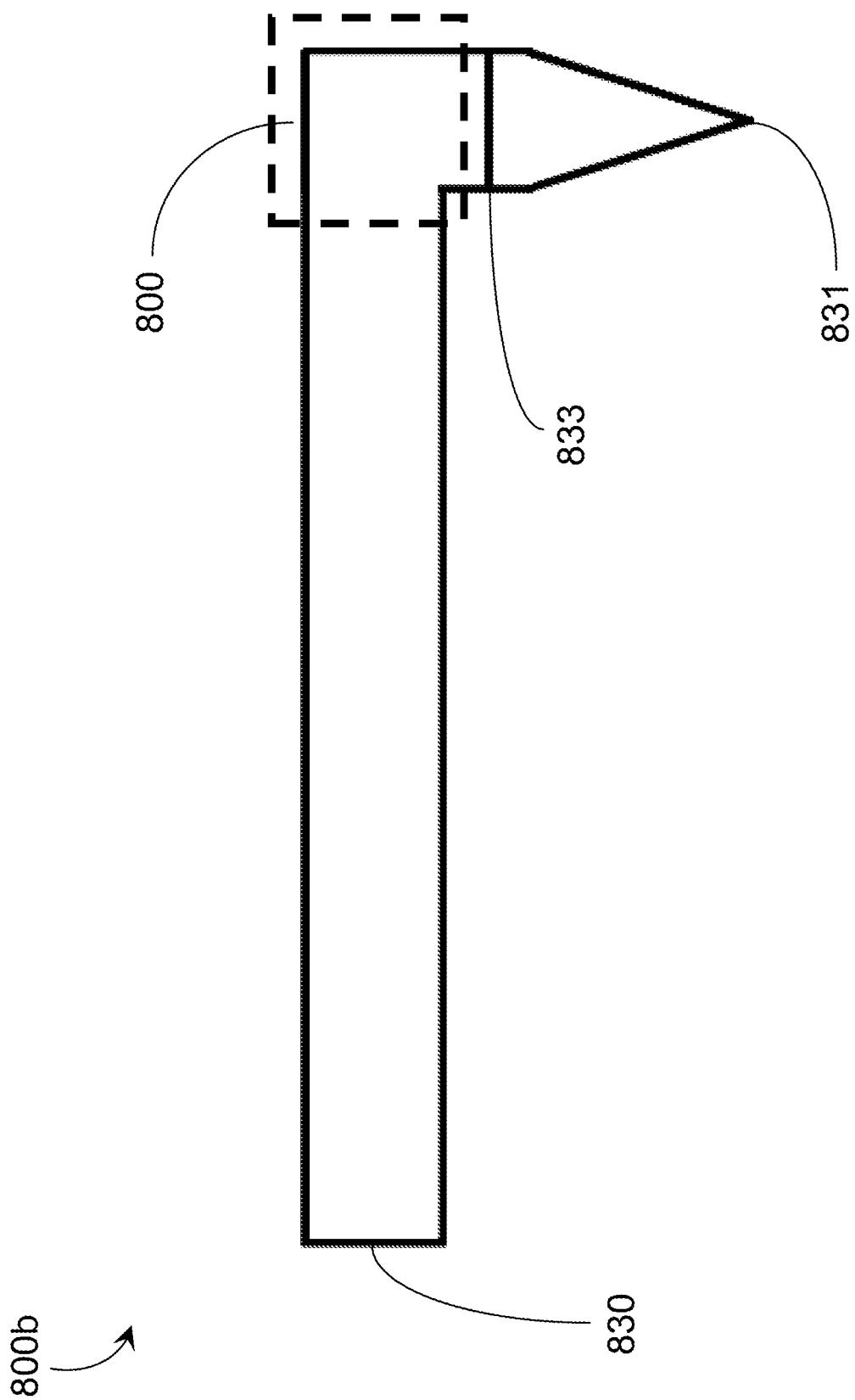
FIG. 8B is a side elevational view of a superconducting needle including a bend in its length according to one illustrated embodiment, for use in a superconducting probe card.

As previously discussed, a superconducting probe card needle may include at least one bend at some point along its length such that the tip of the needle extends through a hole (such as hole 730) in the probe card PCB. FIG. 8B shows a superconducting needle 800b for use in a superconducting probe card, according to one illustrated embodiment. Needle 800b is similar to needle 800a from FIG. 8A, except that needle 800b includes a bend 820 in its length. Those of skill in the art will appreciate that the relative proportions of needle 800b may vary in different embodiments. For instance, bend 820 may occur closer to end 830 or closer to tip 831 as needed. Similarly, while bend 820 is shown as being approximately 90 degrees, those of skill in the art will appreciate that a bend of a different angle, either more or less than 90 degrees, may be used in alternative embodiments. Furthermore, the border 833 between zinc and tungsten-rhenium on the surface of needle 800b may occur at a different position relative to bend 820 in various embodiments. In some embodiments, needle 800b may include a second bend, similar to bend 820, proximate end 830 to facilitate contact with a specific conductive trace or contact pad on the probe card PCB.

Those of skill in the art will appreciate that the present systems and devices may be implemented with a wide variety of probe card needle designs, not just the probe card needle design illustrated in FIGS. 8A and 8B. For example, the present systems and devices may be implemented using blade probe card needles and/or Kelvin probe card needles.

As previously discussed, in known semiconductor and non-superconducting probe card designs, the needles may be plated with nickel in order to facilitate soldering. In accordance with the present systems and devices superconducting probe card needles may be plated with zinc as opposed to nickel to facilitate soldering. Zinc may be preferred to nickel in the design of a superconducting probe card because zinc is a superconducting material while nickel is not. Furthermore, many applications of superconducting electronics, such as superconducting quantum computation, may be particularly sensitive to magnetic fields. In such applications, it may be desirable to predominantly use materials that are substantially non-magnetic. Both zinc and tungsten-rhenium alloys are substantially non-magnetic and suitable for use in a magnetically quiet environment.

Those of skill in the art will appreciate that the superconducting probe card needles described in the present systems and devices may be plated with an alternative superconducting and readily solderable material. For example, in some embodiments at least a portion of a superconducting probe card needle may be plated with lead, tin, or an alloy of tin/lead. An alloy of tin/lead has a higher critical temperature than zinc, and for this reason may be preferred in embodiments that are operated at higher cryogenic temperatures (e.g., liquid Helium-4 temperatures). Those of skill in the art will recognize that the critical temperature of zinc is such that it may not be superconducting at liquid Helium-4 temperatures. However, in such applications the thickness of the zinc layer may be on the order of a few microns, thereby providing a resistance that may be negligible in some applications.

A further aspect of the present systems and devices is the use of a superconducting PCB in a superconducting probe card. A superconducting PCB, such as PCB 701 in FIG. 7, includes conductive traces that are formed by (or plated with) a superconducting material. Such traces are used as superconducting communication conduits connecting between the contact pads 711 on the PCB 701 and some external signal distribution system. For example, in a system-testing implementation, the superconducting traces on PCB 701 may connect to an input/output system of a dip probe that is used for fast testing of circuits in a bath of liquid refrigerant. Alternatively, in a full-system implementation, the superconducting traces on PCB 701 may connect to superconducting communication conduits in a full-scale input/output system such as that described in U.S. patent application Ser. No. 12/016,801 and/or that described in U.S. patent application Ser. No. 12/256,332.

In some embodiments of the present systems and devices, at least two superconducting probe card needles may be superconductingly communicably coupled to the same conductive trace or contact pad on the superconducting PCB. Such embodiments may be particularly suited for providing communication conduits with multiple chips using a single probe card device. In such applications, each of the at least two superconducting probe card needles that are coupled to the same conductive trace on the superconducting PCB may also be superconductingly communicably coupled to a respective SIC.

The various embodiments described herein provide systems and devices for a superconducting probe card. A superconducting probe card can be advantageous in applications involving testing of SICs, as well as in applications involving full implementation of SICs. The probe card approach may be advantageous over other means of establishing communicative connections with an integrated circuit, such as wire-bonding, because connecting (and disconnecting) a probe card with an integrated circuit can be done very quickly. The superconducting probe cards described herein provide a substantially non-magnetic communicative interface with a SIC, where the communicative interface may include a plurality of communication conduits and each communication conduit provides a substantially uninterrupted superconducting path through the probe card into and from the SIC.

Throughout this specification and the appended claims, the term "superconducting" when used to describe a physical structure such as a "superconducting needle" is used to indicate a material that is capable of behaving as a superconductor at an appropriate temperature. A superconducting material may not necessarily be acting as a superconductor at all times in all embodiments of the present systems and devices.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other analog processors, not necessarily the exemplary quantum processors generally described above.

The various embodiments described above can be combined to provide further embodiments. To the extent that they are not inconsistent with the specific teachings and definitions herein, all of the U.S. patents, U.S. patent application publications, U.S. patent applications, referred to in this specification and/or listed in the Application Data Sheet including but not limited to U.S. Provisional Patent Application Ser. No. 61/039,041, filed Mar. 24, 2008 and entitled "Systems, Methods And Apparatus for a Superconducting Probe Card", and U.S. Provisional Patent Application Ser. No. 61/039,710 filed Mar. 26, 2008 and entitled "Systems, Devices, And Methods for Analog Processing," and which are assigned to the assignee of this application are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A quantum processor comprising:
a plurality of unit cells tiled over an area such that each unit cell is positioned adjacent at least one other unit cell, each unit cell comprising:
a first set of qubits and a second set of qubits, wherein each qubit in the first set of qubits crosses at least one qubit in the second set of qubits; and
a set of intra-cell coupling devices, wherein each intra-cell coupling device is positioned proximate a respective point where a qubit in the first set of qubits crosses a qubit in the second set of qubits and provides controllable communicative coupling between the qubit in the first set of qubits and the qubit in the second set of qubits;
and the quantum processor further comprising:
a set of inter-cell coupling devices, wherein each inter-cell coupling device in the set of inter-cell coupling devices is positioned between a respective pair of qubits in adjacent unit cells and provides controllable communicative coupling between the respective pair of qubits in adjacent unit cells.

2. The quantum processor of claim 1 wherein the quantum processor comprises a multi-layered integrated circuit.

3. The quantum processor of claim 2 wherein the quantum processor comprises a superconducting quantum processor and the multi-layered integrated circuit comprises a multi-layered superconducting integrated circuit.

4. The quantum processor of claim 3 wherein each qubit comprises a loop of superconducting material interrupted by at least one Josephson junction.

5. The quantum processor of claim 4 wherein each coupling device comprises a loop of superconducting material interrupted by at least one Josephson junction.

6. The quantum processor of claim 4 wherein each loop of superconducting material is elongated along a respective longitudinal axis and, in each unit cell:
the respective longitudinal axis of each qubit in the first set of qubits is parallel to the respective longitudinal axis of each of the other qubits in the first set of qubits and the respective longitudinal axis of each qubit in the second set of qubits is parallel to the respective longitudinal axis of each of the other qubits in the second set of qubits.

7. The quantum processor of claim 6 wherein, in each unit cell:
the respective longitudinal axis of each qubit in the first set of qubits is perpendicular to the respective longitudinal axis of each qubit in the second set of qubits such that each qubit in the first set of qubits perpendicularly crosses at least one qubit in the second set of qubits.

8. The quantum processor of claim 1 wherein, in each unit cell:
the first set of qubits includes at least four qubits and the second set of qubits includes at least four qubits, such that the unit cell includes at least eight qubits.

9. The quantum processor of claim 1 wherein each unit cell is positioned horizontally adjacent, vertically adjacent, and/or diagonally adjacent at least one other unit cell.

10. The quantum processor of claim 9 wherein each unit cell is positioned adjacent at least three other unit cells such that each unit cell is positioned horizontally adjacent at least one other unit cell, vertically adjacent at least one other cell, and diagonally adjacent at least one other cell.

11. The quantum processor of claim 1 wherein, in each unit cell:
at least a portion of each qubit in the first set of qubits is carried in a first layer and at least a portion of each qubit in the second set of qubits is carried in a second layer, such that at each respective point where a qubit in the first set of qubits crosses a qubit in the second set of qubits, the qubit in the first set of qubits and the qubit in the second set of qubits are in different layers.

12. The quantum processor of claim 11 wherein, in each unit cell:
at least a portion of each intra-cell coupling device and/or at least a portion of each inter-cell coupling device is carried in the second layer.

13. The quantum processor of claim 11 wherein, in each unit cell:
at least a portion of at each intra-cell coupling device and/or at least a portion of each inter-cell coupling device is carried in a third layer.

14. The quantum processor of claim 11 wherein, in each unit cell:
at least a portion of each qubit in the first set of qubits is carried in the second layer and/or at least a portion of each qubit in the second set of qubits is carried in the first layer.

15. The quantum processor of claim 1 wherein at least one respective pair of qubits in adjacent unit cells comprises a first qubit in the first set of qubits in a first unit cell and a second qubit in the first set of qubits in a second unit cell, wherein the second unit cell is adjacent the first unit cell, such that at least one inter-cell coupling device provides controllable communicative coupling between the first qubit in the first set of qubits in the first unit cell and the second qubit in the first set of qubits in the second unit cell.

16. The quantum processor of claim 15 wherein at least one respective pair of qubits in adjacent unit cells comprises a first qubit in the second set of qubits in a first unit cell and a second qubit in the second set of qubits in a third unit cell, wherein the third unit cell is adjacent the first unit cell, such that at least one inter-cell coupling device provides controllable communicative coupling between the first qubit in the second set of qubits in the first unit cell and the second qubit in the second set of qubits in the third unit cell.

17. The quantum processor of claim 1 wherein the respective pairs of qubits in adjacent unit cells include a first set of respective pairs of qubits in adjacent unit cells and a second set of respective pairs of qubits in adjacent unit cells, and wherein:
each respective pair of qubits in the first set of respective pairs of qubits in adjacent unit cells comprises a first qubit in the first set of qubits in one unit cell and a second qubit in the first set of qubits in an adjacent unit cell; and
each respective pair of qubits in the second set of respective pairs of qubits in adjacent unit cells comprises a first qubit in the second set of qubits in one unit cell and a second qubit in the second set of qubits in an adjacent unit cell.

* * * * *

UNITED STATES PATENT AND TRADEMARK OFFICE
CERTIFICATE OF CORRECTION

PATENT NO. : 8,772,759 B2  
APPLICATION NO. : 13/611672  
DATED : July 8, 2014  
INVENTOR(S) : Paul Bunyk et al.

Page 1 of 1

It is certified that error appears in the above-identified patent and that said Letters Patent is hereby corrected as shown below:

Title Page

Item (60):
"(60) filed as application No. PCT/US2009/037984 on Mar. 23, 2009, now Pat No. 8,421,053.
(60) Provisional application No. 12/934,254, provisional application No. 61/039,041, filed on Mar. 24, 2008, provisional application No. 61/039,710, filed on Mar. 26, 2008."

should read,

--(60) Continuation of application No. 12/934,254, filed as application No. PCT/US2009/037984 on Mar. 23, 2009, now Pat No. 8,421,053.
(60) Provisional application No. 61/039,041, filed Mar. 24, 2008, provisional application No. 61/039,710, filed on Mar. 26, 2008.--.

Signed and Sealed this  
First Day of September, 2015

Michelle K. Lee  
*Director of the United States Patent and Trademark Office*